United States Patent
Fromson et al.

(10) Patent No.: US 8,343,707 B2
(45) Date of Patent: *Jan. 1, 2013

(54) LITHOGRAPHIC PRINTING PLATE FOR IN-SOLIDUS DEVELOPMENT ON PRESS

(75) Inventors: Howard A. Fromson, Stonington, CT (US); William J. Ryan, North Granby, CT (US); William J. Rozell, Simpsonville, SC (US)

(73) Assignee: Anocoil Corporation, Rockville, CT (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/134,286

(22) Filed: Jun. 3, 2011

(65) Prior Publication Data

US 2011/0236830 A1    Sep. 29, 2011

Related U.S. Application Data

(63) Continuation-in-part of application No. 12/799,568, filed on Apr. 27, 2010, now Pat. No. 8,137,897, which is a continuation-in-part of application No. 12/586,764, filed on Sep. 28, 2009, now Pat. No. 8,133,658, which is a continuation-in-part of application No. 11/493,183, filed on Jul. 26, 2006, now Pat. No. 7,816,065.

(60) Provisional application No. 60/704,140, filed on Jul. 29, 2005.

(51) Int. Cl.
 *G03F 7/00* (2006.01)
 *B41F 7/00* (2006.01)

(52) U.S. Cl. ............... 430/270.1; 430/273.1; 430/281.1; 101/453; 101/263.1

(58) Field of Classification Search .................. 101/453; 430/270.1, 281.1, 302
See application file for complete search history.

(56) References Cited

U.S. PATENT DOCUMENTS

| | | | |
|---|---|---|---|
| 3,136,637 A | 6/1964 | Larson | 96/75 |
| 3,891,439 A | 6/1975 | Katz et al. | 96/49 |
| 4,058,443 A | 11/1977 | Murata et al. | |
| 4,123,272 A | 10/1978 | Quinn | |
| 4,166,152 A | 8/1979 | Baker et al. | 428/522 |
| 4,186,006 A | 1/1980 | Kobayashi et al. | |
| 4,229,520 A | 10/1980 | Bratt et al. | |
| 4,315,065 A | 2/1982 | Pigeon et al. | |
| 4,329,422 A | 5/1982 | Langlais | |
| 4,370,406 A | 1/1983 | Jones | |

(Continued)

FOREIGN PATENT DOCUMENTS

EP    1 020 766 A1    1/2000

*Primary Examiner* — Cynthia Kelly
*Assistant Examiner* — Chanceity Robinson
(74) *Attorney, Agent, or Firm* — Alix, Yale & Ristas, LLP

(57) ABSTRACT

A printing plate having a substrate and a radiation sensitive, negative working, organic, polymerizable, photosensitive (PS) resin coating non-ionically adhered to the substrate such that the cohesion of the PS coating exceeds the adhesion of the PS coating to the substrate. The PS coating contains active components that participate in radiation induced polymerization, all of which active components are soluble in non-aqueous solvents and none of which active components are soluble or dispersible in any of the group of fluids consisting of water, fountain solution, ink, and press ink. The PS coating has sufficient cohesion and surface tack to adhere to and be mechanically pulled off the substrate by press ink as particulates without dissolution or dispersion into the press ink.

16 Claims, 8 Drawing Sheets

U.S. PATENT DOCUMENTS

| | | | |
|---|---|---|---|
| 4,391,940 A | 7/1983 | Kuhls et al. ................ 524/458 |
| 4,468,453 A | 8/1984 | Nakamura et al. |
| 4,533,620 A | 8/1985 | Walls et al. |
| 4,562,142 A | 12/1985 | Kakumaru et al. |
| 4,563,410 A | 1/1986 | De Jaeger et al. |
| 4,612,276 A | 9/1986 | Browne ........................ 430/302 |
| 4,645,730 A | 2/1987 | Fromson et al. |
| 4,708,925 A | 11/1987 | Newman |
| 4,956,261 A | 9/1990 | Pawlowski et al. .......... 430/156 |
| 5,141,841 A | 8/1992 | Wade .......................... 430/281.1 |
| 5,223,041 A | 6/1993 | Cerney ............................ 134/15 |
| 5,252,431 A | 10/1993 | Yoshida et al. ............... 430/303 |
| 5,254,429 A | 10/1993 | Gracia et al. ................. 430/162 |
| 6,071,675 A | 6/2000 | Teng ............................. 430/302 |
| 6,387,595 B1 | 5/2002 | Teng ............................. 430/302 |
| 6,482,571 B1 | 11/2002 | Teng ............................. 430/302 |
| 6,548,222 B2 | 4/2003 | Teng ........................... 430/278.1 |
| 6,576,401 B2 | 6/2003 | Teng ............................. 430/303 |
| 6,590,011 B1 | 7/2003 | Rappoport et al. ........... 522/170 |
| 6,723,495 B2 | 4/2004 | Ray et al. |
| 6,727,044 B1 | 4/2004 | Fujimaki et al. |
| 6,727,045 B2 | 4/2004 | Fujii |
| 6,740,466 B1 | 5/2004 | Matsumoto et al. ....... 430/270.1 |
| 6,749,995 B2 | 6/2004 | Matsumura |
| 6,841,336 B2 | 1/2005 | Kondo |
| 6,878,505 B2 | 4/2005 | Shibuya |
| 6,884,561 B2 | 4/2005 | Fromson et al. |
| 6,899,994 B2 | 5/2005 | Huang et al. |
| 6,899,998 B2 | 5/2005 | Figov |
| 6,902,865 B2 | 6/2005 | Teng ............................. 430/302 |
| 6,912,956 B2 | 7/2005 | Mori ............................. 101/459 |
| 7,011,928 B2 | 3/2006 | Takamuki |
| 7,041,429 B2 | 5/2006 | Ohta et al. |
| 7,041,431 B2 | 5/2006 | Urano et al. |
| 7,089,856 B2 | 8/2006 | Teng ............................. 101/451 |
| 7,186,498 B2 | 3/2007 | Gries et al. ................... 430/331 |
| 7,189,494 B2 | 3/2007 | Knight et al. ............. 430/281.1 |
| 7,329,058 B1 | 2/2008 | Fromson et al. ............. 396/611 |
| 7,350,991 B1 | 4/2008 | Fromson et al. ............. 396/611 |
| 7,358,034 B2 | 4/2008 | Teng ............................. 430/302 |
| 7,427,465 B2 | 9/2008 | Teng ............................. 430/302 |
| 7,645,567 B2 | 1/2010 | Teng ............................. 430/302 |
| 7,655,382 B2 | 2/2010 | Teng ............................. 430/302 |
| 7,700,266 B2 | 4/2010 | Fromson et al. ............. 430/302 |
| 7,709,184 B2 | 5/2010 | Teng ............................. 430/302 |
| 7,752,966 B2 | 7/2010 | Teng ............................. 101/451 |
| 7,790,355 B2 | 9/2010 | Teng ............................. 430/302 |
| 7,816,065 B2 | 10/2010 | Fromson et al. ........... 430/270.1 |
| 7,833,336 B2 | 11/2010 | Valentini ..................... 106/31.75 |
| 7,867,691 B2 | 1/2011 | Fromson et al. ............. 430/302 |
| 2003/0054282 A1 | 3/2003 | Fromson et al. ............. 430/165 |
| 2003/0186165 A1 | 10/2003 | Gries et al. |
| 2003/0207202 A1 | 11/2003 | Fujita et al. ............... 430/270.1 |
| 2004/0221876 A1 | 11/2004 | Waleh et al. .................... 134/30 |
| 2005/0018013 A1 | 1/2005 | Nelson et al. ................... 347/44 |
| 2005/0069811 A1 | 3/2005 | Mitsumoto et al. |
| 2005/0123853 A1 | 6/2005 | Munnelly et al. |
| 2005/0130064 A1 | 6/2005 | West et al. ................. 430/281.1 |
| 2005/0266350 A1 | 12/2005 | Suzuki et al. |
| 2006/0024614 A1 | 2/2006 | Williamson |
| 2006/0046191 A1 | 3/2006 | Sakata |
| 2006/0046199 A1 | 3/2006 | Mitsumoto et al. |
| 2006/0188814 A1 | 8/2006 | Sakata |
| 2006/0254738 A1 | 11/2006 | Anderson et al. ............. 162/175 |
| 2007/0009829 A1 | 1/2007 | Teng |
| 2007/0072127 A1 | 3/2007 | Teng |
| 2007/0095232 A1 | 5/2007 | Teng ............................. 101/467 |
| 2007/0101886 A1 | 5/2007 | Teng |
| 2007/0119323 A1 | 5/2007 | Teng ............................. 101/454 |
| 2007/0172765 A1 | 7/2007 | Teng ............................. 430/302 |
| 2007/0214987 A1 | 9/2007 | Sonokawa et al. |
| 2007/0254241 A1 | 11/2007 | Teng ............................. 430/302 |
| 2007/0289468 A1 | 12/2007 | Teng ............................. 101/467 |
| 2008/0274429 A1 | 11/2008 | Teng ............................. 430/303 |
| 2008/0280234 A1 | 11/2008 | Teng ............................. 430/325 |
| 2008/0318163 A1 | 12/2008 | Fromson et al. ............. 430/302 |
| 2009/0025591 A1 | 1/2009 | Teng ........................... 101/450.1 |
| 2009/0061364 A1 | 3/2009 | Teng ............................. 430/432 |

RELATIONSHIPS OF COHESION (C) AND ADHESION (A) IN FIGS. 8, 9, 10

| X/Y | C1 | C2 | C3 | A1 | A2 | A3 | A4 | A5 | A6 | A7 |
|-----|-----|-----|-----|-----|-----|-----|-----|-----|-----|-----|
| C1 | - | < | N/A | > | < | < | N/A | < | N/A | N/A |
| C2 | > | - | > | > | < | > | > | > | N/A | N/A |
| C3 | N/A | < | - | > | < | > | < | < | N/A | N/A |
| A1 | < | < | < | - | < | < | N/A | < | N/A | N/A |
| A2 | > | > | > | > | - | N/A | > | N/A | N/A | N/A |
| A3 | > | < | < | > | N/A | - | N/A | < | N/A | N/A |
| A4 | N/A | < | > | N/A | < | N/A | - | < | N/A | N/A |
| A5 | > | < | > | > | N/A | > | > | - | < | < |
| A6 | N/A | N/A | N/A | N/A | N/A | N/A | N/A | > | - | N/A |
| A7 | N/A | N/A | N/A | N/A | N/A | N/A | N/A | > | N/A | - |

Relationships are X> or <Y
N/A means not applicable or not critical

Figure 11

LITHOGRAPHIC PRINTING PLATE FOR IN-SOLIDUS DEVELOPMENT ON PRESS

RELATED APPLICATIONS

This is a continuation-in-part of U.S. application Ser. No. 12/799,568 filed Apr. 27, 2010 for "Processless Development of Printing Plate", which is a continuation-in-part of U.S. application Ser. No. 12/586,764 filed Sep. 28, 2009 for "Non-Chemical Development of Printing Plates", which is a continuation-in-part of U.S. application Ser. No. 11/493,183 filed Jul. 26, 2006 for "Imageable Printing Plate for On-Press Development", which claims priority under 35 U.S.C. §119 (e) from U.S. Provisional Application No. 60/704,140 filed Jul. 29, 2005, for "Imageable Printing Plate for On-Press Development", and benefit under 35 U.S.C. §120 is also claimed from U.S. application Ser. No. 11/821,721 filed Jun. 25, 2007 for "Water Spray Development of Planographic Plates" and U.S. application Ser. No. 12/215,124 filed Jun. 25, 2008 for "Heated Water Spray Processor". The complete disclosures of these applications are hereby incorporated by reference.

BACKGROUND OF THE INVENTION

The present invention relates to the on-press processing of imaged lithographic printing plates.

Plates of interest have a solvent-soluble, radiation-polymerizable, oleophilic resin coating on a hydrophilic substrate. In conventional practice; after image-wise exposure at ultraviolet (UV), visible, or infrared (IR) wavelengths, the plates are developed with solvent to remove the unexposed areas of the coating by dissolution, thereby producing a substantially planographic pattern of oleophilic and hydrophilic areas. The developed plates are then ready for mounting on a cylinder of a printing press, where the plates are subjected to fountain fluid and ink for transfer of ink to a target surface according to the pattern of oleophilic and hydrophilic areas on the plate.

Although a process is known for developing IR imaged plates with water rather than solvent, the coating is not polymerized by the imaging. Instead, the coating contains microspheres or beads of thermally fusible material suspended in a water-soluble medium or matrix. The plate is imaged at high energy levels (250-350 mj/cm$^2$) such that the microspheres fuse to themselves and the substrate. The imaged plates can be developed with water or fountain fluid on-press, whereby the imaged, fused areas remains intact whereas the unimaged, non-fused areas including microspheres are removed via dissolution of the matrix.

Not only is a high level of energy required for imaging such plates, but the rate of imaging is slow and the resolution is low. Also, the dissolved matrix with microspheres is a chemical waste that must be specially treated.

Thus, it should be appreciated that almost all existing negative-working planographic lithographic printing plates, with the exception of those produced by ablation in the imager, are produced by laying down a continuous film of radiation-sensitive coating on a suitable hydrophilic substrate such as grained, anodized, and hydrophilized aluminum sheet, or its equivalent, imaging the radiation-sensitive coating with actinic ultra-violet, violet, or infra-red energy in an image-wise fashion, and subsequently subtracting the non-irradiated portions of the imaged plate by the process of solubilization or dispersion, thus establishing oleophilic image areas and water receptive non-image areas.

The water soluble materials that are used in these coatings typically comprise polymers, monomers, and various components of the initiator system and in some cases additives. The purpose of using these water soluble materials is to aid in the development that takes place on press. These materials are needed to insure that the non imaged areas of the plate are completely "cleaned out" and remain water receptive. The main problem with this type of development is that these water soluble materials dissolve in the fountain solution.

Dissolution of these water soluble materials results in two very distinct problems. First, the colorant system that is used in the coating (usually a blue green material) mixes with the colored inks, causing them to shift in color. Second, the water soluble materials also act as emulsifiers which cause the ink to emulsify in the fountain solution. As a consequence, the ink and water can no longer differentiate between imaged and background areas. This causes the plate to scum in the background and image to go blind.

SUMMARY

A photosensitive (PS), especially IR sensitive, coating is comprised of water insoluble active materials. When the coated plates are developed on press the PS coating is removed from the background (non image) areas of the plate in a totally solid phase. There is no resin, dye, or colorant in the PS coating that will dissolve or disperse in either the fountain solution or the press ink.

Such PS coating that is removed from the plate is also completely removed from the press by being carried out with the printed waste or leader paper during the initial roll up. This is in contrast with known press-developable coatings in which water soluble raw materials are incorporated into the coating. Use of non water soluble materials eliminates these problems completely.

According to one aspect, a printing plate has a substrate and a radiation sensitive, negative working, organic, polymerizable, photosensitive (PS) resin coating non-ionically adhered to the substrate such that the cohesion of the PS coating exceeds the adhesion of the PS coating to the substrate. The PS coating contains active components that participate in radiation induced polymerization, all of which active components are soluble in non-aqueous solvents and none of which active components are soluble or dispersible in any of the group of fluids consisting of water, fountain solution, ink, and press ink. The PS coating has sufficient cohesion and surface tack to adhere to and be mechanically pulled off the substrate by press ink as particulates without dissolution or dispersion into the press ink.

The plate characteristics permit the blanket and a film of press ink between the blanket and the PS coating on the plate, to mechanically dislodge and removing all the nonimage PS coating areas of the plate from the substrate as particles. The blanket then transfers all the removed PS coating particles onto the print media, whereby none of the nonimage PS coating dissolves or disperses in the ink emulsion.

The fracturing phenomenon and removal of the unimaged film in particulate form only is attributable to the combined factors that the as-dried PS coating on the plate is not soluble in water and has an adhesion to the plate substrate that is less than its cohesion. By subjecting the entire imaged surface to this mechanical force the unimaged areas of the PS coating are mechanically dislodged from the substrate in the form of particulate matter in solidus, i.e., without any solubilization or dispersion process.

Furthermore, because the fractured particles have not undergone solubilization, they do not adhere to each other to form agglomerates in the processor, nor do they adhere to the rubber, polymer, or metal of the processor or the plate.

On-press the high-tack press inks adhere very well to the imaged plate surfaces, in both the imaged and unimaged areas. During start-up, when the blanket compresses against the inked surface of the imaged plate, the high-tack adhesion of the ink to the blanket exceeds the adhesion of the unimaged areas of the plate, and the cohesion of the unimaged areas of the plate also exceeds the adhesion to the plate, so the fractured non-image particles are pulled onto the blanket and deposited on the paper web by the blanket and eventually end up in the initial start-up paper waste. The imaged areas have both adhesion and cohesion greater than the ink.

It should be appreciated that, whereas the active ingredients in the dried, unimaged areas of the PS coating are only soluble in a non-aqueous solvent, these areas are removed (i.e., the plate is "developed") without use of any such solvent. In this context, "active" means an ingredient that participates in the radiation induced polymerization in the imaged areas. This generally means the active ingredients are a polymer, a monomer and/or oligomer, at least one polymerization or cross link initiator, and a dye.

The imageable PS coating as initially applied and dried on the substrate, has a relatively low degree of adhesion to the substrate. This is preferably achieved by using a substrate having a grained, positively charged (anionic) hydrophilic surface to which the coating mildly adheres non-ionically as a result of drying. Such substrate can be a grained aluminum sheet treated with silicate or other known hydrophilizing agents. Drying produces a mild degree of cohesion, such that the bottom surface of the coating mechanically interengages and thus adheres to the irregularities in the grained surface of the substrate, and the body of the coating achieves sufficient cohesion to permit further handling, shipment, and imaging of the plates. For on-press development, the cohesion of the dried, unimaged coating is greater than its adhesion to the substrate and its tack or adhesion to the ink and blanket roll is greater than its adhesion to the substrate, but the adhesion of the imaged coating to the substrate is greater than its adhesion to the ink.

Upon imaging of the plates, the radiation induced polymerization causes the adhesion and cohesion of the imaged areas to become much higher than the adhesion and cohesion of the unimaged areas. Diazo compounds have been used by some practitioners to increase the adhesion of imaged areas in essentially photopolymerizable coatings. However, the coatings for use in the present invention are diazo-free, because with diazo based coatings (whether applied in aqueous or non-aqueous solution) the dry coating bonds ionically to the substrate and can only be removed via chemical reaction with non-aqueous (organic) solvent.

Without limiting the scope of the claims corresponding to the inventive concept, we can ascribe the best results at least in part to a combination of non-diazo based resins and associated polymerization initiating agents, which produce low adhesion to the substrate in the manufactured plate yet can quickly produce high adhesion where radiation imaged.

Practitioners in this field had no reason to investigate or optimize the difference in adhesion of non-aqueous photopolymerizable resins as a basis for non-chemical, and especially mechanical, removal of the nonimage areas. Because it was the established practice that nonimage areas of the imaged plate could be substantially completely dissolved by the non aqueous developer solution, the main objective of others for improving coatings has been to increase the adhesion, cohesion, and durability of the imaged areas and thereby enable the plate to better withstand the rigors of the printing press. Any desired relationship between the imaged and unimaged areas was based on relative solubility, not relative mechanical adhesion, to minimize incidental dissolution of any of the exposed surface of the imaged areas while the developer solution dissolved substantially all of the non image areas. The present invention avoids such incidental dissolution of the imaged areas because the development mechanism does not rely on dissolution or dispersion.

Preferably, none of any components of the PS coating is soluble in press ink or fountain water, e.g., such as pigment dispersion, a stabilizer, an IR dye, organo-borate catalyst, and an onium salt or triazine catalyst.

The preferred active components include from about 5 to about 30 wt % based on solids content, of a urethane acrylate resin and from about 35 to about 75 wt % based on solids content, of a radically polymerizable, multifunctional acrylate monomer and/or oligomer.

The plates can be heated after imaging to increase the difference in cohesion and adhesion of the coating to the substrate as between the imaged and unimaged areas, such that a greater force can be applied to the plates to dislodge only the unimaged areas. In particular, a thermally imageable negative working plate can be exposed to heat for a short period of time after imaging, whereby the imaged portions become more stable and tougher, while the portions of the coating that are to be removed are not significantly affected. The heating step preferably, but not necessarily, immediately follows the imaging step, but can be at a different location from the imaging step.

In a further preference, the water soluble top coat conventionally used to protect photosensitive (PS) coatings is washed off the PS coating after imaging (and after any subsequent heating step) and the plates stored temporarily until mounted on press. The top coat is typically a water soluble film former (such as PVOH) that prevents atmospheric oxygen from diffusing into the coating and quenching the free radicals necessary for inducing polymerization. The removal of this topcoat has been found to substantially immunize the imaged coating from further polymerization in the unimaged areas due to ambient light. Thus, the plates need not be handled in yellow or other special light between imaging and mounting on press.

BRIEF DESCRIPTION OF THE DRAWINGS

FIG. 11 is a matrix showing the relationships of the adhesion and cohesion among the unimaged coating, imaged coating, substrate, ink, ink roll, blanket roll, and printable media during the on press development represented in FIGS. 8-10.

DESCRIPTION OF THE PREFERRED EMBODIMENTS

Printing Press Process

Figure 1:
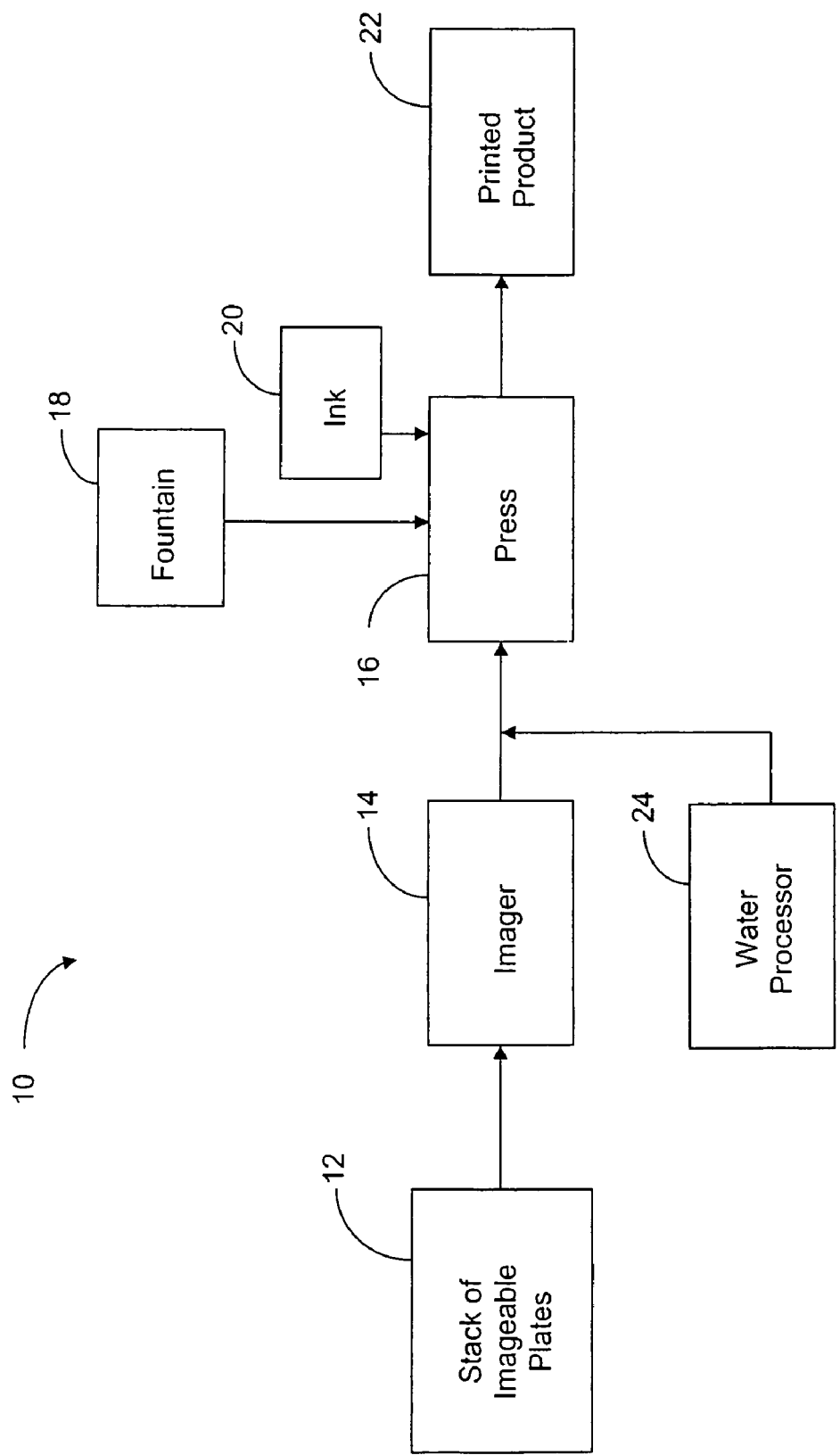
FIG. 1 schematically shows a printing system comprising plate stack, imager, and press.

FIG. 1 shows a schematic of a printing plant 10, such as for newspaper printing, in which a stack of radiation imageable plates 12 is situated upstream of an imager 14, where the coating on the plates is selectively highly cross linked by selective exposure to radiation to form a pattern of highly cohesive and adhesive areas, and areas that exhibit less cohesion and adhesion. The plate substrate is hydrophilic, whereas the coating is oleophilic. The radiation exposure produces high internal cohesion, and high adhesion to the plate. In a conventional negative working system, the original (unimaged) coating is soluble in a specified developer solvent, so the imaged plate must be developed with such solvent to remove the non-exposed areas and thus produce a plate usable in the press. The developer solutions most frequently used contain either some amount of an organic solvent (typically benzyl alcohol) or have an elevated pH (alkaline).

Unlike conventional systems, the present invention delivers the imaged plates directly from the imager 14 to the press 16, wherein contact with the ink form roll 20 and blanket roll (not shown) remove the non-image areas. In another embodiment fountain fluid 18 may also be employed 20. The unimaged coating material is quickly dislodged to reveal areas of the underlying substrate, which have an affinity for fountain fluid, and the retained imaged areas, which have an affinity for ink. Once developed in this manner, the resulting printing plates can be run in the conventional fashion to produce the printed product, which is output at 22.

As an optional configuration, the imaged plates may be sent to a processing station 24, where no special treatment is required other than contact with a spray of pH neutral water (e.g., tap water). A preferred spray can be achieved with a nozzle pressure over about 1000 psi, but if accompanied by brushing or similar wiping action the water pressure can be lower. This wiping can be achieved as part of or immediately after the water processing at 24. The plates can then be dried and stacked, before a fully or substantially fully processed plate is sent to the press 16.

The most evident advantages of the foregoing process, are that no separate developing equipment or step is required between the imager 14 and the press 16, and no resin is dissolved or dispersed into the process water. Rather, all or most of this coating detaches from the substrate in sufficiently large pieces that can be readily removed by filtration and relatively easily disposed of.

Imageable Plate

Figure 2:
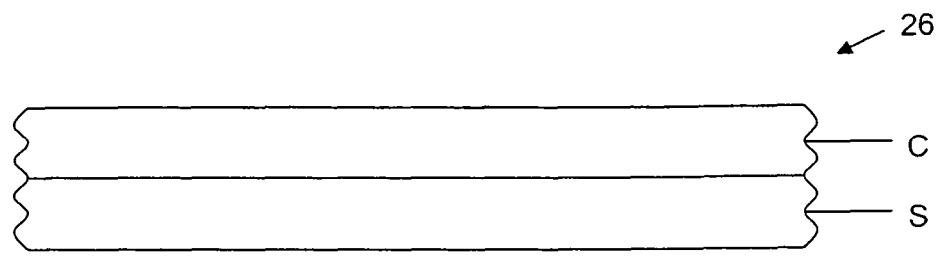
FIG. 2 is a schematic plate cross section showing an imageable coating directly supported on a substrate.

FIGS. 2-6 illustrate schematically, the physical attributes of a plate according to the present invention. FIG. 2 is a schematic section view of the basic embodiment 26, consisting of a substrate or carrier S on which an organic, non-aqueous solvent-based coating C has been applied and dried. The substrate S is preferably a grained, anodized aluminum sheet. The substrate is preferably post treated with a hydrophilizing agent prior to coating. Such post treatments are well known in the art, and include silicate solutions, polyvinylphosphonic acid (PVPA) or amino trimethylenephosphonic acid (ATMPA). The coating C is applied from a solvent soluble composition comprising one or more components capable of cross linking by free radical polymerization. The polymerization arises as a result of imaging with ultraviolet, visible or infrared radiation. As such, the coating may further comprise radiation absorbers and/or initiators to facilitate the cross linking efficiency. None of these active components is soluble in water. Preferred coating compositions further comprise a polymeric material to enhance the oleophilicity and durability of the coating in the ink receptive printing areas.

Figure 3:
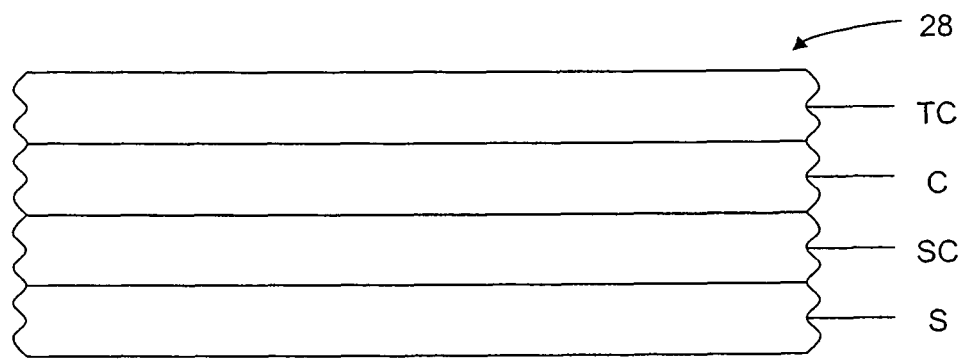
FIG. 3 is a schematic plate cross section showing an imageable plate with a subcoat and top coat.

FIG. 3 is a schematic section view of a plate according to an alternative embodiment where a subcoat SC has been applied to the substrate S, the imageable coating C is applied over the subcoat, and a topcoat TC is applied over the imageable coating. The top coat TC is typically a water soluble film forming layer such as polyvinyl alcohol (PVOH) that serves to prevent atmospheric oxygen from diffusing into the coating and quenching the free radicals. Without the topcoat, the polymerization efficiency is dramatically decreased. The subcoat SC is a water soluble material that facilitates the release of the coating from the substrate in the unimaged areas. The subcoat SC must not adversely impact the adhesion of the coating to the substrate in the imaged areas of the coating. 4-hydroxybenzene sulfonic acid, sodium salt has been found to be particularly suitable as a subcoat.

Figure 4:
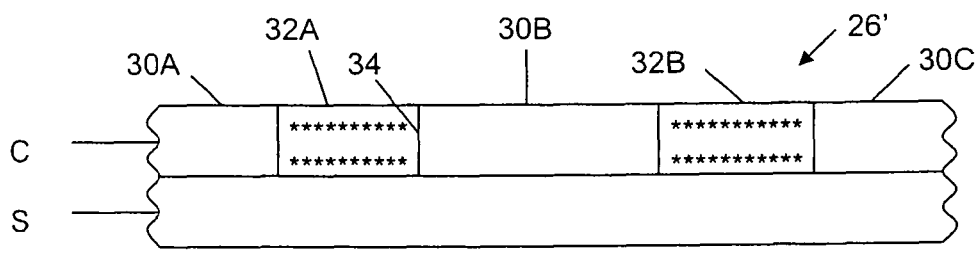
FIG. 4 is a schematic plate cross section upon exposure to radiation.

FIG. 4 corresponds to FIG. 2, and illustrates the effect on the coating of exposure to imaging radiation. The radiation source is preferably a digitally controlled laser, which produces exposure pixels such that a pattern of unexposed coating 38a, 30b, and 30c and exposed coating 32a and 32b covers substantially all of the plate. However, any of the sources of incident imaging radiation used in the art to form selectively written surfaces can be used. The selective imaging results in relatively distinct boundaries 34 at the interface between the imaged and unimaged areas. It should be appreciated that the Figures are not to scale, especially as to relative thickness of the coating and substrate, but are merely illustrative. For the illustrated negative working plate, the exposed coating in areas 32a, 32b becomes highly cross linked, thereby creating areas that have sufficient cohesion and adhesion such that they are not removable by subjecting these areas to substantial mechanical forces or pressure. The unexposed areas 30a, 30b, and 30c retain the original characteristics and properties of the dried coating before imaging. This material is not highly cross linked, and lacks the adhesion to withstand substantial mechanical forces or pressure.

Figure 5:
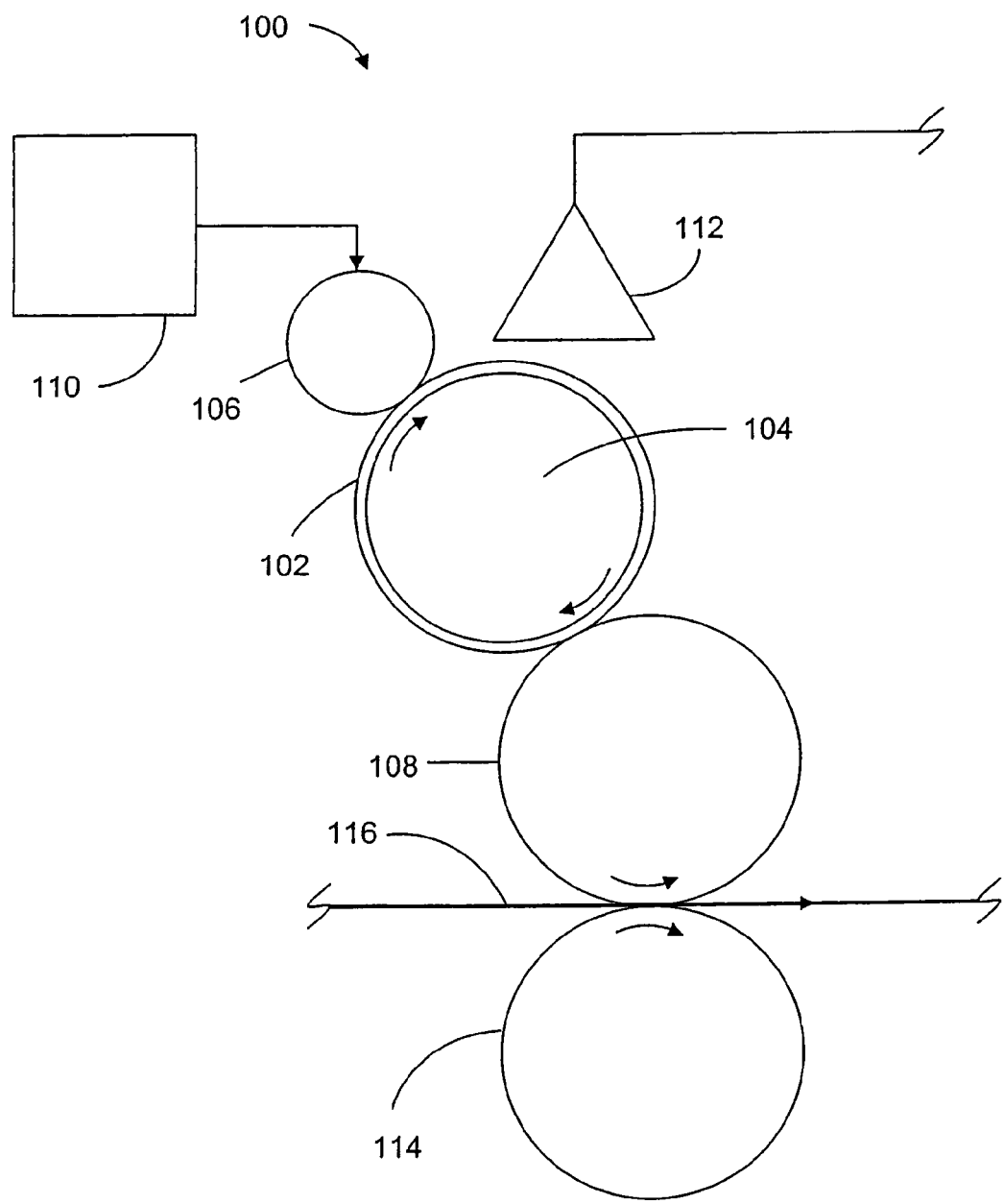
FIG. 5 is a schematic of on-press development of an imaged plate.

FIG. 5 illustrates the context of development on press 100. The imaged plate 102 has been mounted to a plate cylinder 104 in contact opposition to an ink form roll 106 and a blanket roll 108. The ink roll is generally made of rubber and the ink is generally supplied to the ink roll from a source 110 as an emulsion of water in a continuous ink medium. A fountain fluid distributor 112 is provided for the plate cylinder 104 and a rubber roll 114 is in opposition to the blanket roll 108.

During normal printing with a developed printing plate, press ink is applied to the rotating plate 102 and it immediately splits, with the ink portion attracted to the oleophilic areas and the water portion attracted to the hydrophilic areas. Fountain fluid is deposited on the upper portion of the plate 102, to further assure that the ink portion and water find the oleophilic and hydrophilic areas, respectively, thereby defining the image pattern of ink to be printed on the target medium (e.g., paper). This pattern of ink is first transferred to the blanket 108, which transfers the ink to the paper 116 as the paper passes between the blanket 108 and the opposed rubber roll 114.

With the present invention, after a new plate 102 is mounted on the plate cylinder 104, the plate cylinder is rotated and the ink form roll 106 is activated, with or without activation of the fountain fluid supply 112, depending on whether the plate has a water soluble top coat. A film of press ink emulsion arises between the ink roll cylinder 106 and the entire surface of the plate 102. The continuous ink medium adheres to the entire (oleophilic) surface of the plate, exhibiting sufficient cohesion and adhesion to detach the ink from the ink roll 106. However, the adhesion of the unimaged areas of the plate 102 to the substrate is so low that the blanket 108 pulls the unimaged areas off the substrate, as frangible particles. Thus, the mechanical removal forces are applied by the blanket roll puling ink and unimaged coating material adhered to the ink, off the substrate. For this to occur, in the unimaged areas the adhesion (tack) and cohesion of the ink exceed both the cohesion of the coating and its adhesion to the substrate, and the adhesion of the ink to the blanket exceeds the adhesion of the unimaged areas to the substrate. These particles are transferred by the blanket roll 108 to the paper 116. As with conventional startup of a newly installed plate, a paper leader or sacrificial paper sheets are passed through the press during up to a few hundred startup revolutions of the plate roll 104. With the present invention, these startup revolutions completely remove the non-image areas, with all of the removed coating material transferred to the sacrificial sheets 116. These can be disposed of as solid waste, without chemical treatment. After startup, the fountain supply 112 is activated and normal printing begins on the developed plate.

Figure 6:
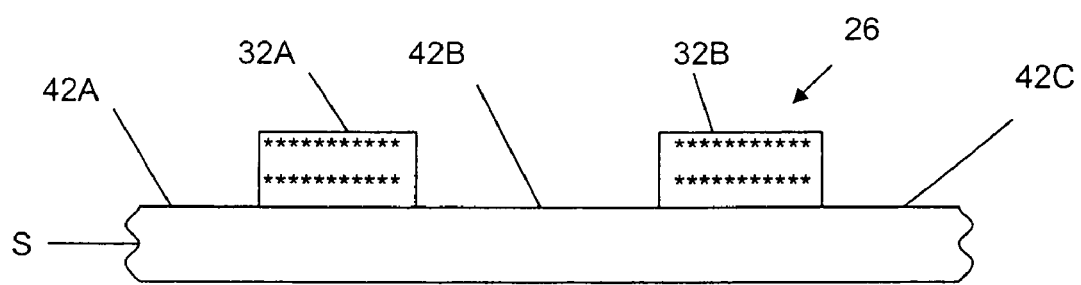
FIG. 6 is a schematic plate cross section showing the pattern of remaining oleophilic imaged areas of the coating and the hydrophilic substrate surface areas where the unimaged areas have been removed in solidus.

FIG. 6 shows a portion the resulting plate 26 (flattened for convenience) ready for production runs with areas 32a and 32b representing the oleophilic coating areas that pick up ink and 42a, 42b, and 42c representing the hydrophilic substrate surfaces that carry the fountain fluid. It is to be understood that the plates and process described herein are essentially planographic and, as noted above, the relative thickness of the areas and surfaces shown in the figures should not be considered as in scale.

Figure 7:
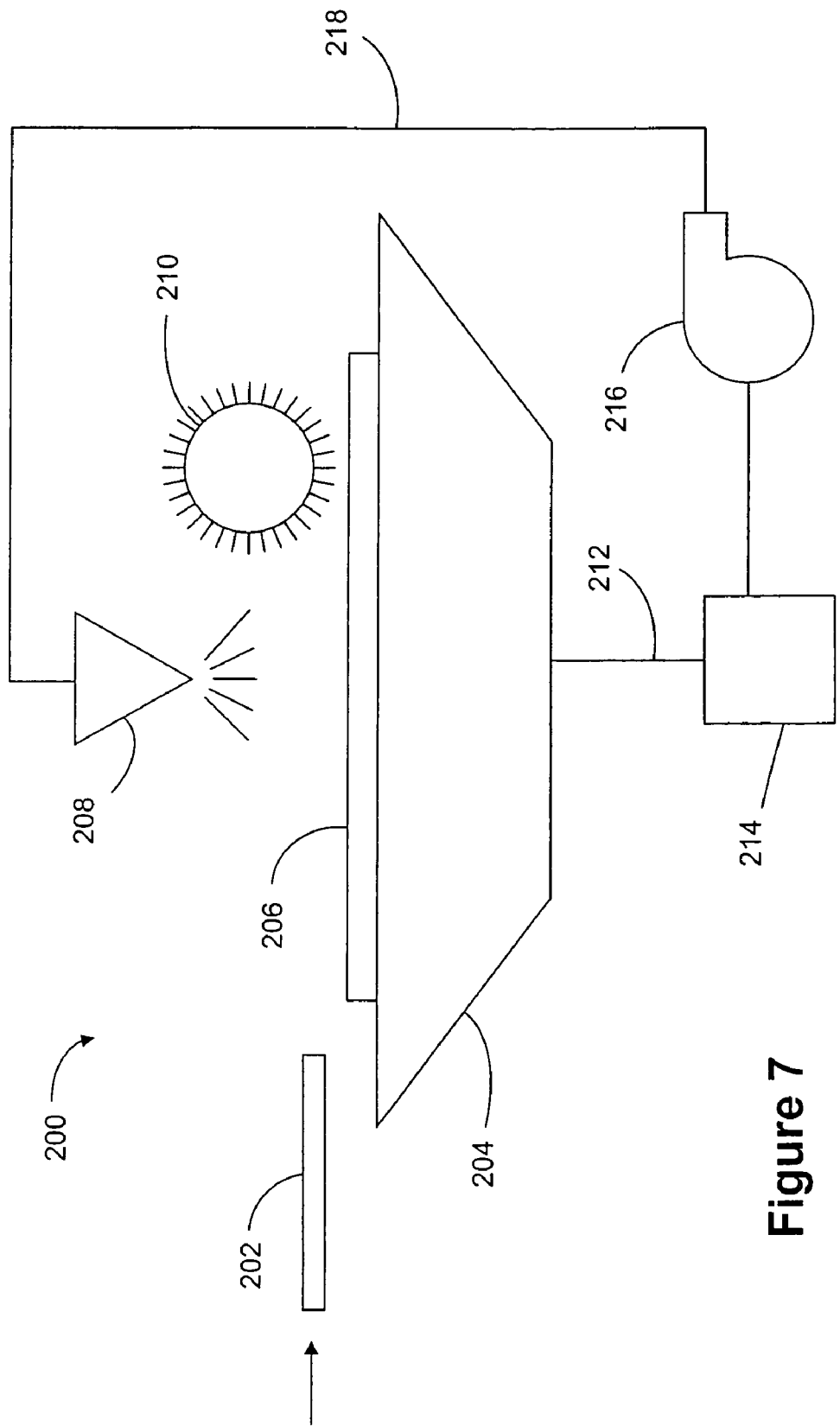
FIG. 7 is a schematic of one embodiment of a pre-press water processor.

FIG. 7 is a schematic of the operative components of one possible processor 200 for the pre-press water development of an imaged plate in a system as depicted in FIG. 1 (where the water processor is indicated at 24). It should be appreciated that the coating formulation and its relationship to the substrate and press ink, offers the options of development with rotating brushes in an aqueous environment, development on press in reliance on the tack of the ink and blanket roll, or a combination of the two. In the illustrated development, the imaged plate 202 is conveyed over a basin or tank 204 onto a platen 206 or the like. In one option a high pressure spray 208 impinges on the plate surface and mechanically removes the unimaged areas from the substrate, as particles, but a more cost-effective option is for simple water deposition with reliance on the mechanical action of a rotary the brush 210 to achieve the removal. The overflowing water with removed particles is captured in the basin or sump 204 and continuously drained and delivered via line 212 to particle filter 214. The filtered water is recirculated back to the spray nozzle 218 by pump 216 and return line 218. The resinous material removed as particles is trapped in the filter, so there is little or no chemical treatment required of the waste stream associated with developing the plate.

One significant advantage is that the unimaged areas of the plate have less tendency to retain ink receptive coating residue than on a conventionally developed plate. With conventional development, the coating must be completely dissolved and removed in the developing step. It is sometimes problematic to ensure that all coating is removed from the interstices of the substrate grain. Any residual will remain during the printing process and cause some level of ink pick-up in the background. With the present invention, the coating in the background areas is only mildly adhered to the substrate, so is fully removable. In any event, even a residual of coating material will be removed soon after printing start-up, resulting in a cleaner background.

Another significant advantage is that the integrity of the imaged coating is not adversely affected by the processing liquid, i.e., water or fountain fluid. For conventional plates, the imaging process causes a change in the solubility of the coating in the developer. The change is never 100% efficient; that is, even the imaged coating will have some level of solubility in the developer. This residual solubility may significantly alter the adhesive and/or cohesive integrity of the coating. The present invention does not suffer from this problem.

Coating of Representative Embodiment

In one embodiment associated with the basic configuration shown in FIG. 2, the coating comprises from about 5 to about 30 wt % based on solids content, of a polymer that is generally considered by practitioners of applied chemistry, as insoluble in water. The polymer material may be selected from a wide range of types such as but not limited to acrylates, siloxanes, and styrene maleic anhydrides.

Advantageously, the coating comprises from about 35 to about 75 wt % based on solids content, of a polymerizable monomer, a polymerizable oligomer, or combination thereof that is similarly insoluble in water. Some suitable radically polymerizable (cross linkable) materials are a multifunctional acrylate such as Sartomer 399 and Sartomer 295 commercially available from Sartomer Co.

The coating comprises a non-water-soluble initiator system capable of initiating a polymerization reaction upon exposure to imaging radiation. Some suitable initiator systems comprise a free radical generator such as a triazine or an onium salt.

Additional optional components include dyes that absorb the imaging radiation (e.g. infrared absorbing dyes) and pigments or dyes that serve as colorants in the coating.

The coating can include a "release agent" such as 4-hydroxybenzene sulfonic acid, sodium salt 4-HBSA, 4-hydroxybenzoic acid or sodium benzoate. In a different embodiment the release agent is disposed as a sub-coating between the hydrophilic substrate and the imageable coating.

EXAMPLES

In a first trial at a commercial newspaper printing facility, a negative working, photopolymerizable plate was imaged with IR radiation at 90 mj/cm$^2$ and developed on press during startup as described above, then used in the normal manner to print over 100,000 high quality newspaper sheets. The plate was constituted as follows:
    (a) grained, hydrophilized aluminum substrate
    (b) imageable coating comprising the raw materials
        (i) organic solvent
        (ii) polyvinyl butyral polymer resin
        (iii) penta functional acrylate monomer
        (iv) pigment dispersion
        (v) partially water soluble stabilizer
        (vi) IR dye
        (vii) organo-borate catalyst
        (vii) onium salt catalyst
        (viii) partially water soluble additive (DTTDA)
    (c) PVOH topcoat After thermal imaging, the plate was post-heated. It is believed this step produces further cross linking in the imaged areas but not in the unimaged areas. After cooling, the topcoat was washed off with tap water. Several hours after the topcoat was removed, the plate was mounted on the plate cylinder of a commercial newspaper printing press, with standard news paper, ink roll, blanket roll and rubber roll set up. During startup only the ink roll was active, and the plate was developed and background areas satisfactorily cleaned out within about 300 revolutions of the plate cylinder.

Another trial press run was made with a plate that was identical to that of the first run, except for the omission of the partially water soluble organic compound (DTTDA) stabilizer. The results showed no significant difference. For commercial production, another, water-insoluble stabilizer (e.g., for increasing shelf-life) can be used.

These trials support the conclusion that unimaged areas can be cleaned out on press corresponding to print dot (pixel) density targets between 0 percent to at least about 98 percent, and most likely at least 99 percent.

If the plates are developed off-press with water and brushing or other devise that impinges or impacts, the targets are achieved between about 0 percent to about 97 percent. The remaining unimaged coating is not a thin layer, but rather in the form of small clumps that cling to the substrate at the corners of certain imaged letters, numbers, and symbols. This remaining material is cleaned out with the ink roll onto the blanket and paper on press.

Figures 8, 9:
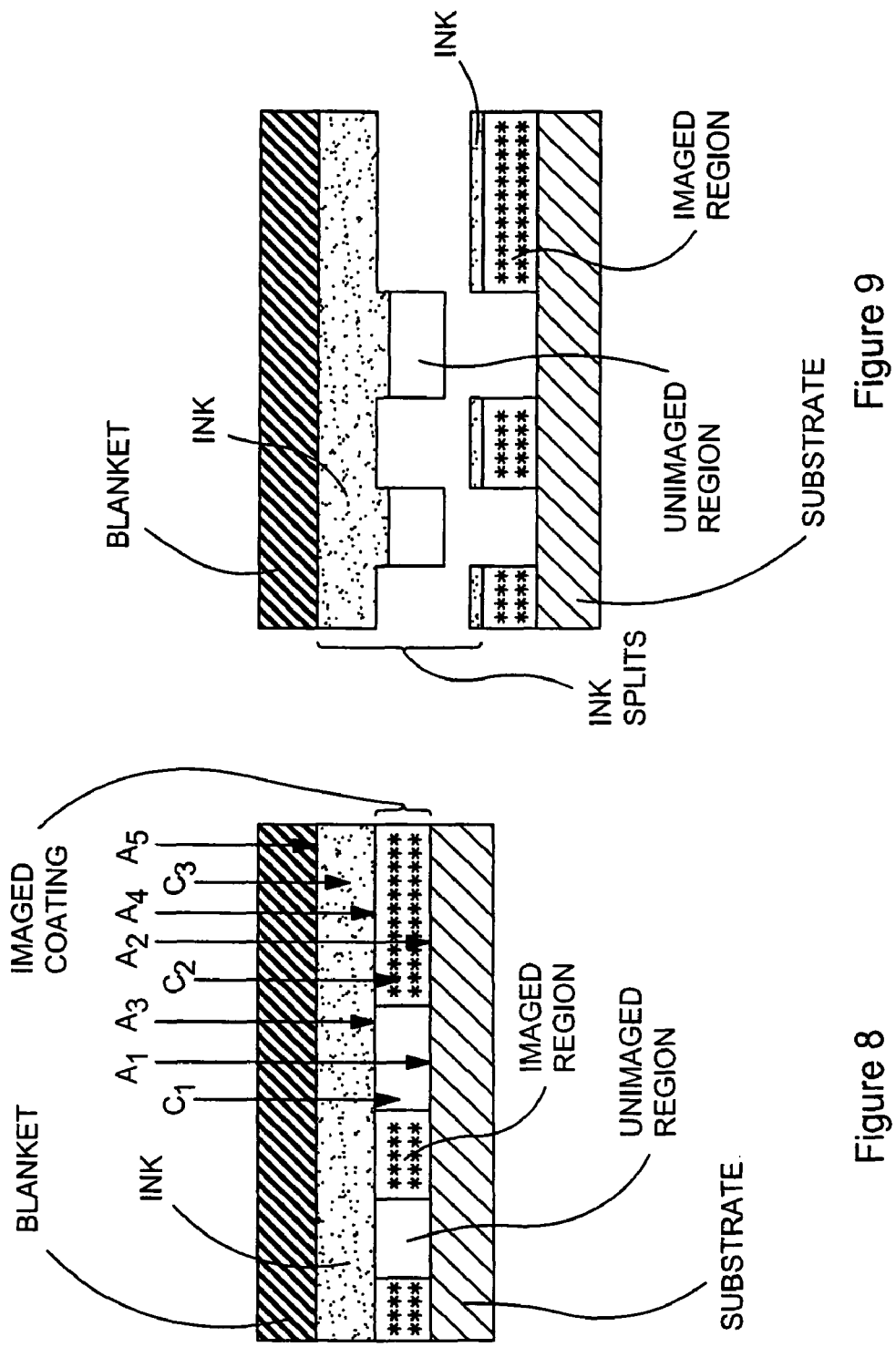
FIG. 8 is a schematic representation of the interface between the imaged plate and the blanket roll during development on-press.
FIG. 9 is a schematic representation of the interface between the imaged plate and the blanket roll as the roll pulls off the unimaged areas during development on-press.
Figure 10:
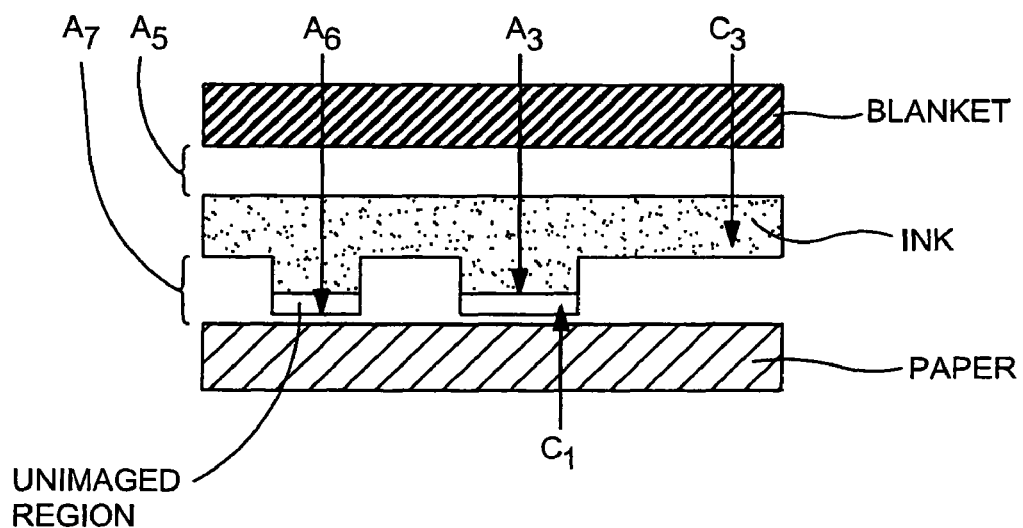
FIG. 10 is a schematic representation of the interface between the blanket roll and the printable media as the ink and unimaged material is transferred to a waste leader during development on-press.

FIGS. 8-11 disclose in greater detail the manner in which the unimaged coating is removed from the substrate (i.e., the plate is "developed") on press. FIG. 8 is a schematic representation of the interface between the imaged plate and the blanket roll during development; FIG. 9 is a schematic representation of the interface between the imaged plate and the separating blanket roll during development; FIG. 10 is a schematic representation of the transfer of ink and unimaged coating from the blanket roll to the printable media; and FIG. 11 is a matrix showing the relationships of the adhesion and cohesion among the unimaged coating, imaged coating, substrate, ink, ink roll, blanket roll, and printable media during the on press development represented in FIGS. 8-10. In these Figures, arrows with alphanumeric identifiers point to either the inside of a given material (to indicate cohesion) or to the interface between two materials (to indicate adhesion). "A" indicates adhesion and "C" indicates cohesion.

FIG. 11 shows the desired relationships among the adhesions and cohesions, to be understood by first selecting an A or C entry in the first column and then finding its relationship to another A or C at the intersection of the row of the first selection and the column of the other A or C. For example, C1 is greater than A1 and C1 is less than A3 (which is equivalent to A1 less than C1 and A3 greater than C1).

FIG. 8 shows the condition on press, after the ink has been applied to the imaged plate and the inked plate has been rotated into contact with the blanket. Whether pure ink or an emulsion of water in pure ink was applied (collectively, "ink"), the ink adheres to the entire coating, because at this point the entire coating is oleophilic.

FIG. 9 shows a subsequent point in time, at which the imaged plate on the plate cylinder is separating from contact with the blanket. In the unimaged regions the tack and cohesion of the ink exceeds the adhesion of the coating to the substrate, and the cohesion of the coating exceeds its adhesion to the substrate. The split in the unimaged regions occurs between the coating and the substrate. The unimaged regions are removed in solidus from the substrate along with the overlying ink, while attached to the surface of the ink and without dispersing into the ink. No dissolution of the coating should occur or the split would take place within the coating and leave some coating on the substrate. In the imaged regions, the adhesion of the coating to the substrate and its cohesion exceed the cohesion of the ink, thus causing the ink to split within itself, such that some ink remains on the imaged regions of the coating and some remains on the blanket.

FIG. 10 depicts the interaction of the blanket after separation from the plate, with the sacrificial paper or leader on which the removed coating material is transferred for disposal. The ink and attached particles of unimaged coating preferentially adhere to the paper, which goes to waste disposal. The area of the blanket where such transfer occurred is returned into contact with the plate as depicted in FIG. 8. This is repeated until all the unimaged coating has been removed from the entire plate, thus "developing" the plate. The developed plate has a pattern of areas of hardened, oleophilic coating material and hydrophilic substrate, which are compatible with conventional wet lithographic printing presses.

It should be appreciated that whether development is fully or partially implemented pre-press or on-press, the coating is not dispersible in water (or equivalent fountain solution) or ink, i.e., the mere immersion of the coating in water pre-press or in fountain solution or ink on-press, does not produce a suspension or solution of coating material in the water, fountain, or ink. Only after the application of mechanical force (with or without the presence of water or ink) do particles of unimaged coating release from the substrate.

If development is undertaken in a two step embodiment, whereby approximately 95% or more of the unimaged coating is removed by high pressure water spray or water deposition with rotating brushes upstream of the press and the residual unimaged coating is removed by the tack of the ink on press, the particles are initially removed as a result of active disturbance. Relatively large particles are dislodged from the substrate, and are carried away from the plate surface by the flow of water. However, the particles do not distribute or mix in the water flow, but rather are merely swept away such that any water with entrained particles drawn from such flow into a vessel will separate as by settling at the bottom of the vessel or floating. The residual unimaged coating removed on-press by the ink and blanket in the second step remains adhered to the surface of the ink during removal from the substrate and transfer to the blanket and sacrificial leader paper, without any dispersion.

To the extent the particles entrained in the flow are to be filtered for reuse of the water, it is preferred that such flow be agitated (as by pumping) to thereby temporarily distribute the particles so that they can be more uniformly filtered across the full cross section of the filtering means.

Thus, the mechanical forces imparted by or during contact with a fluid such as water, fountain solution or ink, disrupt and remove only the unimaged areas of the coating from the substrate surface in the form of undissolved particulate material, without dispersing the unimaged areas of the coating into the fluid at the substrate surface as a mechanism of removal from the substrate. The fluid can be the agent by which the coating material removed from the surface of the substrate is transferred from the plate to another operation, such as a filter in the first step or the blanket of the second step.

With the pre-press developing embodiment, the brushes remove the coating whereas the water is merely a flushing agent to carry away the removed solid particles. Water alone (without high pressure spray) cannot remove the unimaged coating. The coating could be removed by the brushes alone but for convenience the brushes are in the water environment for the desired flushing action. With pre-press development, the brushes are relatively coarse and that is why some non-imaged material remains on the plate, which material is later removed on press via the tack of the ink. This does not imply that the tack of the ink must apply a greater force than the brushes.

On-press development occurs via the ink having been applied to the plate such that the tack of the ink in contact with the blanket pulls the unimaged material off the plate. There cannot be simple water or fountain development on press without the ink roll on the plate. It should be understood that the term "ink" is used herein according to the conventional meaning when discussing lithographic printing, whereby the ink is typically an emulsion of water entrained in a continuous ink phase. Reference herein to the "tack" or "adhesion" of the ink encompasses pure ink and such ink emulsion.

In a facility where the development is on press, a pre-press water/brush station or localized steam discharge may desirably be adapted to process only an edge or corners of the plate where reference numbers or markers were imaged. The pre-press step will reveal the markers to the press operator for confirmation that the correct plate is to be mounted and properly aligned in the press. Preferably the entire plate includes a top coat of a water soluble oxygen barrier as well as at least one imaged region of the coating defining a latent reference mark at a margin of the plate. After imaging of the plate, the topcoat is washed off with water and the unimaged areas of only the margin are removed with water to reveal the reference mark before subjecting the remaining coating to mechanical forces development forces on press.

Coating Chemistry Including Enhancement for Water Penetration

The following tables contain descriptions of the coating constituents and variations in the percentage content, associated with multiple examples of predecessor coatings in which the coating contained a non-photosensitive, solvent soluble, organic compound that is partially soluble in water. The imaged plates were developed by immersion in water and then wiped with a cloth. Although these tests were not performed in a system as depicted in FIGS. 1 and 5 with only mechanical force as the developing agent, the effects of varying the ingredients in a laboratory are believed applicable for optimizing performance in a production setting where mechanical force is provided by a high pressure spray. It should be appreciated, however, that with development according to the invention in a water spray processor or on press, there would be much less tendency of redeposition of removed coating material as reported for some tests.

In each instance, the plates were prepared in a conventional manner in a laboratory, with conventional coating weight of 100 mg/sq.ft., drawn down with a wire wound stainless steel rod, and dried for two minuets at 90° C. All plates had a topcoat of PVOH at 140 mg/sq.ft. All plates having triazine were imageable with UV, and all plates with a dye sensitive to 830 nm light source, such as the KF-1151, were imageable with IR. The results reported with each table are based on conventional IR imaging at about 90-100 mj/sq.cm. A dash in a column indicates that the wt % value is the same as the entry in the previous column of the same row.

If the plates are to be processed in a dedicated station upstream of the press by immersion in water and a wiping action milder than what a plate experiences on—press, the coating could be augmented by a release agent, as shown in Table 1.

Table 2 shows that for a given polymer (Clar. Poly 123) and monomer (Sartomer 399) combination, the relative weight percent is a significant variable. Ratios of monomer to polymer in the range of at least about 1:1 to about 5:1, preferably about 2:1 to about 4:1 are likely to work well, given that the ratio of 0.5:1 (Plate #4) produced only fair results, the ratio of 4:1 (Plate #3) produced excellent results, and the ratio of about 9:1 (Plate #2) produced only fair results.

Table 3 shows the result that satisfactory plates can be made from polymer resins that do not necessarily have a reaction to radiation exposure. The coatings of Plates #1 and #3 have reactive resins that produced good results, and the coatings of Plates #4 and #5 have non-reactive resins that produced good to fair results. The potential for use of non-reactive resins opens the door for use of resins having a much higher molecular weight than presently used resins.

Table 4 demonstrates that not all monomers at a given weight percent of the coating, produce equivalent results, with some producing poor results. Similarly, Table 5 demonstrates that potential stabilizers other than DTTDA that are soluble in the non-aqueous solution and are partially soluble in water, do not necessarily produce satisfactory results.

Table 6 demonstrates that potential release agents other than 4-HBSA that are fully soluble in both non-aqueous solutions and water can be successfully utilized.

Table 7 demonstrates that a coating that is sensitive to both UV and IR radiation can be successfully imaged and processed in water according to the invention.

Table 8 demonstrates that good results do not depend on use of only one kind of initiator.

Table 9 shows that the use of coinitiator compounds and/or post-imaging heating, can improve the performance of the plates.

In Table 9 the organo-borate compound is P3B, made by Showa Denko K.K., headquartered in Tokyo, Japan. The P3B can be used as the sole initiator. It is believed that used individually, the listed initiators would rank from strongest to weakest as Diphenyl Iodonium hexaflouro phosphate, Triazine AC, and P3B. The reason for using a coinitiator system rather then increasing a single initiator is that there is a synergistic effect between the organo-borate and either the triazine or onium catalyst. Given a fixed amount of energy the initiators individually (at their optimum level) will only produce a certain amount of free radicals. However, when the organo-borate is combined with one of the other catalysts, free radicals are generated at a faster rate by the triazine or onium catalyst while free radicals are still generated (at a normal rate) from the organo-borate. Therefore the efficiency of the system is increased in both rate and population. By using this combination, a much higher degree of cross-linking is realized, which improves both adhesion and cohesion of the image. With an increase in adhesion and cohesion, an increased amount of release agent can be used, thereby providing for better development.

Depending on the type of equipment used for the post-imaging thermal enhancement, a different range of times and temperatures should be used. With a convection oven, both the temperature and dwell time are greater than with a small preheat oven unit (where the plate comes in direct contact with the heating element). As a rough guide, 200 deg. F. at 1 minute in a convection oven has approximately the same effect as 175 deg. F. for 7 seconds in a preheat oven. With a typical commercially available preheat unit, the window would be 175 to 250 deg. F. for a time period of 5 to 15 seconds.

Tests were also run on the six formulations shown in Table 9, for comparison of UV versus IR exposures. Previous formulations which did not contain the organo-borate co-initiator system were UV sensitive only when they contained the Triazine AC. The onium salt by itself was not UV sensitive. Incorporating the organo-borate into the formulation rendered the formulations that contained the onium salt UV sensitive. All six of the formulations that contained the co-initiator system produced a good image when exposed to either IR or UV. In order to simplify the testing formulation #5 was chosen for testing in UV exposures.

Using an Ugra scale for comparison, plates were exposed for 250, 125 and 62.5 mjs. The plates were then developed through a water bath with two molleton socks at 4 feet per minute at 75 degrees F. The resulting step wedges were 250 mj—solid 9 steps with 2 gray steps to a total of 11, 125 mj—solid 7 steps with 2 gray steps to a total of 9 and 62.5 mj—solid 5 steps with 2 gray steps to a total of 7. All of the images from the different exposures exhibited very good solvent resistance. The best resolution that was received was at 62.5 mjs, which yielded an open 15 micron line target and good screen values from 2% to 99%.

TABLE 1

Coating Compositions With Partially Water Soluble Stabilizer As The Significant Variable
4-Hydroxy B S A and DTTDA

|  | #1 | #2 | #3 | #4 | #5 | #6 |
|---|---|---|---|---|---|---|
| Meth. Prop.[a] | 92.39% | 91.99% | 92.27% | 91.77% | 91.77% | 91.77% |
| Sartomer 399[b] | 2.31% | 2.31% | 2.31% | 2.31% | 2.31% | 2.31% |
| Clariant Poly 123[c] | 0.46% | 0.46% | 0.46% | 0.46% | 0.46% | 0.46% |
| Triazine AC[d] | 0.45% | 0.45% | 0.45% | 0.45% | 0.45% | 0.45% |
| DTTDA[e] | 0.00% | 0.40% | 0.00% | 0.40% | 0.52% | 0.00% |
| 4-HBSA[f] | 0.00% | 0.00% | 0.12% | 0.12% | 0.00% | 0.52% |
| KF-1151[g] | 0.05% | 0.05% | 0.05% | 0.05% | 0.05% | 0.05% |
| Pigment Disp.[h] | 4.34% | 4.34% | 4.34% | 4.34% | 4.34% | 4.34% |
|  | 100.0% | 100.0% | 100.0% | 100.0% | 100.0% | 100.0% |

[a] Solvent (1-Methoxy-2-Propanol, Propylene Glycol Methyl Ether available from Arco Chemical Company)
[b] Monomer (Dipentaerythritol Monohydroxypentaacrylate available from Sartomer Company, West Chester, Penn.)
[c] Polymer
[d] Initiator
[e] Stabilizer
[f] Release Agent
[g] Dye
[h] Pigment Results:
1 Plate would not develop
2 Plate showed slight signs of development
3 Plate had partial development with heavy redeposition
4 Plate developed very easily producing an image with good adhesion, good dot reproduction and a clean background.
5 Plate did not develop any better than plate #2
6 Plate developed in a very non uniform way yielding a weak image and redeposition

TABLE 2

Coating Compositions With Monomer/Polymer Ratio As The Significant Variable
Monomer/Polymer Ratio

|  | #1 | #2 | #3 | #4 | #5 | #6 |
|---|---|---|---|---|---|---|
| Meth. Prop. | 92.39% | — | — | — | — | — |
| Sartomer 399 | 2.77% | 2.49% | 2.21% | 1.85% | 0.92% | 0.00% |
| Clar. Poly 123 | 0.00% | 0.28% | 0.56% | 0.92% | 1.85% | 2.77% |
| Triazine AC | 0.45% | — | — | — | — | — |
| DTTDA | 0.40% | — | — | — | — | — |
| 4-HBSA | 0.12% | — | — | — | — | — |
| KF-1151 | 0.05% | — | — | — | — | — |
| Pigment Disp. | 4.34% | — | — | — | — | — |
|  | 100.0 | 100.0 | 100.0 | 100.0 | 100.0 | 100.0 |

Results:
1 Plate produced a good image but the plate was easily over developed. The coating was slow in speed and had poor adhesion to the substrate.
2 Produced a better image than #1 with faster speed but it was still easy to over develop but with better adhesion.
3 Produced a strong image with good adhesion. The coating developed very easily with good dot reproduction and clean background.
4 Produced a very strong image with great adhesion. The coating was more difficult than #3 to develop but had good dot reproduction and a clean background. There was also some evidence of redeposition.
5 Plate showed only very slight development.
6 Plate had no development.

TABLE 3

Coating Compositions With Radiation Sensitive Resin As The Significant Variable
Reactive and Non Reactive Resins

|  | #1 | #2 | #3 | #4 | #5 | #6 |
|---|---|---|---|---|---|---|
| Meth. Prop. | 92.39% | — | — | — | — | — |
| Sartomer 399 | 2.21% | — | — | — | — | — |
| Triazine AC | 0.45% | — | — | — | — | — |
| DTTDA | 0.40% | — | — | — | — | — |
| 4-HBSA | 0.12% | — | — | — | — | — |
| KF-1151 | 0.05% | — | — | — | — | — |
| Pigment Disp. | 4.34% | — | — | — | — | — |
| Clar. Poly 123 | 0.56% | — | — | — | — | — |
| Jaylink 106 | — | 0.56% | — | — | — | — |
| NK-P1002 | — | — | 0.56% | — | — | — |
| Dow Corning 62230 | — | — | — | 0.56% | — | — |
| Sartomer PRO5542 | — | — | — | — | 0.56% | — |
| 4-vinylphenol/MMac. | — | — | — | — | — | 0.56% |
|  | 100.0 | 100.0 | 100.0 | 100.0 | 100.0 | 100.0 |

Results:
1 Produced an image with good dot reproduction and adhesion along with a clean background. Coating was easy to develop.
2 Coating was difficult to develop and produced a broken image with poor adhesion. The background of the plate was clean.
3 The coating was slightly more difficult to develop then #1 but produced an image with good adhesion but significant coating re-deposited on the image. The background area of the plate was clean.
4 This resin (non photo reactive) produced a coating that was easy to develop. The image had good dot reproduction and good adhesion. The image was prone to over development. The background areas of the plate were clean.
5 This resin (non photo reactive) produced a coating that was easy to develop without being over sensitive. The image had good dot reproduction and good adhesion. The background areas of the plate were clean.
6 This resin (non photo reactive) produced a coating that was very difficult to develop. Could not get good dot reproduction or a clean background.

TABLE 4

Coating Compositions With Monomer Type As The Significant Variable
Monomers

|  | #1 | #2 | #3 | #4 | #5 | #6 |
|---|---|---|---|---|---|---|
| Meth. Prop. | 92.39% | — | — | — | — | — |
| Clar. Poly 123 | 0.28% | — | — | — | — | — |
| Triazine AC | 0.45% | — | — | — | — | — |
| DTTDA | 0.40% | — | — | — | — | — |
| 4-HBSA | 0.12% | — | — | — | — | — |
| KF-1151 | 0.05% | — | — | — | — | — |
| Pigment Disp. | 4.34% | — | — | — | — | — |
| SR-399 | 2.49% | — | — | — | — | — |
| SR-454 | — | 2.49% | — | — | — | — |
| SR-350 | — | — | 2.49% | — | — | — |
| SR-295 | — | — | — | 2.49% | — | — |
| CD-580 | — | — | — | — | 2.49% | — |
| SR-348 | — | — | — | — | — | 2.49% |
|  | 100.0 | 100.0 | 100.0 | 100.0 | 100.0 | 100.0 |

Results:
1 (SR-399 Dipentaerythritol Pentaacrylate) This monomer produced a coating that was easy to develop. The image was strong with good dot reproduction and good adhesion. The background area was very clean. The image was slightly sensitive to overdevelopment.
2 (SR-454 Ethoxylated Trimethylolpropane Triacrylate) This monomer produced a coating that was very easy to develop but had a weak image and a dirty background.
3 (SR-350 Trimethylolpropane Triacrylate) This monomer produced a coating that was somewhat difficult to develop. The resulting image was strong but with heavy retention in Background.
4 (SR-295 Pentaerythritol Triacrylate and Tetraacrylate) This Mixture of monomers produced a coating that was almost as easy as #1 to develop. The image was slightly weaker then #1 but the background was clean.
5 (CD-580 Alkoxylated Cyclohexane Dimethanol Diacrylate) This monomer produced a coating that did not develop.
6 (SR-348 Ethoxylated Bisphenol A Dimethacrylate) This monomer produced a coating that was very difficult to get any development.

TABLE 5

Coating Compositions With DTTDA And Other Partially Soluble
Stabilizers As The Significant Variable
DTTDA and Analogous Compounds

|  | #1 | #2 | #3 | #4 | #5 | #6 |
|---|---|---|---|---|---|---|
| Meth. Prop. | 92.39 | — | — | — | — | — |
| Sartomer 399 | 2.31 | — | — | — | — | — |
| Clar. Poly 123 | 0.46 | — | — | — | — | — |
| Triazine AC | 0.45 | — | — | — | — | — |
| 4-HBSA | 0.12 | — | — | — | — | — |
| KF-1151 | 0.05 | — | — | — | — | — |
| Pigment Disp. | 4.34 | — | — | — | — | — |
| DTTDA | 0.40 | — | — | — | — | — |
| Dimethyl Tartrate | — | 0.40 | — | — | — | — |
| Di allyl Maleate | — | — | 0.40 | — | — | — |
| Di allyl Succinate | — | — | — | 0.40 | — | — |
| Dimethyl Maleate | — | — | — | — | 0.40 | — |
| Tetra Methyl Tartaramide | — | — | — | — | — | 0.40 |
|  | 100.0 | 100.0 | 100.0 | 100.0 | 100.0 | 100.0 |

Results:
1 Good development, good image and clean background.
2 Hard to develop, strong image and dirty background.
3 Very slight development.
4 No development
5 No development
6 As good as #1

TABLE 6

Coating Compositions With 4HBSA and Other Soluble
Release Agents As The Significant Variable
4-Hydroxy B.S.A. and Analogous Compounds

|  | #1 | #2 | #3 | #4 |
|---|---|---|---|---|
| Meth. Prop. | 92.39 | — | — | — |
| Sartomer 399 | 2.31 | — | — | — |
| Clar. Poly 123 | 0.46 | — | — | — |
| Triazine AC | 0.45 | — | — | — |
| DTTDA | 0.40 | — | — | — |
| KF-1151 | 0.05 | — | — | — |
| Pigment Disp. | 4.34 | — | — | — |
| 4-HBSA | 0.12 | — | — | — |
| Benzene Sul. Acid | — | 0.12 | — | — |
| 4-Hydroxy Benzoic Acid | — | — | 0.12 | — |
| Sodium Benzoate | — | — | — | 0.12 |
|  | 100.0 | 100.0 | 100.0 | 100.0 |

Results:
1 Control formula - produced a coating that was easy to develop. The image was strong and the background was clean.
2 The coating was not as easy to develop but the image was strong and the background was somewhat clean.
3 This material produced a coating that was as good or better than the control.
4 This coating was equivalent to #2.

TABLE 7

Coating Compositions With Various Infrared
Sensitive Dyes As The Significant Variable
Various 830 Dyes

|  | #1 | #2 | #3 | #4 |
|---|---|---|---|---|
| Meth. Prop. | 92.39 | — | — | — |
| Sartomer 399 | 2.31 | — | — | — |
| Clar. Poly 123 | 0.46 | — | — | — |
| Triazine AC | 0.45 | — | — | — |
| DTTDA | 0.40 | — | — | — |
| 4-HBSA | 0.12 | — | — | — |
| Pigment Disp. | 4.34 | — | — | — |
| KF-1151 | 0.05 | — | — | — |
| ADS-WS | — | 0.05 | — | — |
| Few Chem S0456 | — | — | 0.05 | — |
| Few Chem S0306 | — | — | — | 0.05 |
|  | 100.0 | 100.0 | 100.0 | 100.0 |

Results:
1 This is the control coating which developed easily and produced a good image and clean background.
2 This coating was equivalent to #1 except that the image was not quite as strong.
3 This coating developed easily but did not produce any image.
4 This coating developed easily but produced a very weak image.
Observation; Although not all of the coatings produced an image in the IR all of them did produce strong images in the UV.

TABLE 8

Coating Compositions With Triazine Vs. Onium Salts As The
Significant Variable For Cross Linking Initiators
Initiators: Triazine Vs. Onium Salts

|  | #1 | #2 | #3 |
|---|---|---|---|
| Meth. Prop. | 92.39 | — | — |
| Sartomer 399 | 2.31 | — | — |
| Clar. Poly 123 | 0.46 | — | — |
| DTTDA | 0.40 | — | — |
| 4-HBSA | 0.12 | — | — |
| KF-1151 | 0.05 | — | — |

TABLE 8-continued

Coating Compositions With Triazine Vs. Onium Salts As The
Significant Variable For Cross Linking Initiators
Initiators: Triazine Vs. Onium Salts

|  | #1 | #2 | #3 |
| --- | --- | --- | --- |
| Pigment Disp. | 4.34 | — | — |
| Triazine AC | 0.45 | — | — |
| Diphenyl Iod. PF6 | — | 0.45 | — |
| CD1012 | — | — | 0.45 |
|  | 100.0 | 100.0 | 100.0 |

Results:
1 This is the control formulation which was easy to develop and produced a strong image with a clean background.
2 This formula (with Diphenyliodonium Hexafluorophosphate) developed easier then the control and still produced a strong image with a clean background.
3 This formulation was slightly more difficult to develop than the control. It produced a strong image but a slightly dirty background. (Diaryliodonium Hexaflouroantimonate)

TABLE 9

Post-Imaging Thermal Enhancement and Coating Compositions with Co-Initiators

|  | #1 | #2 | #3 | #4 | #5 | #6 |
| --- | --- | --- | --- | --- | --- | --- |
| Meth. Prop. | 91.87% | 91.77% | 91.25% | 91.87% | 91.77% | 91.25% |
| Sartomer 399 | 2.46% | 2.46% | 2.46% | 2.46% | 2.46% | 2.46% |
| Clar. Poly 123 | 0.31% | 0.31% | 0.31% | 0.31% | 0.31% | 0.31% |
| DTTDA | 0.40% | 0.40% | 0.80% | 0.40% | 0.40% | 0.80% |
| 4-HBSA | 0.12% | 0.12% | 0.24% | 0.12% | 0.12% | 0.24% |
| KF-1151 | 0.05% | 0.05% | 0.05% | 0.05% | 0.05% | 0.05% |
| Pigment Disp. | 4.34% | 4.34% | 4.34% | 4.34% | 4.34% | 4.34% |
| Showa D. 3PB | — | 0.10% | 0.10% | — | 0.10% | 0.10% |
| Triazine AC | 0.45% | 0.45% | 0.45% | — | — | — |
| Diphnly Iod.PF6 | — | — | — | 0.45% | 0.45% | 0.45% |
| Total | 100.0 | 100.0 | 100.0 | 100.0 | 100.0 | 100.0 |

Results:
1a) This is a control type coating formula which developed easily and produced a good image and clean background. The run length of this image was very susceptible to press type and conditions.
1b) Using the same coating formula the plate was put through a pre-heat of 100 degrees C. for 1 minute prior to being mounted on press. The plate still had good development (slightly less then #1a) but had an image that was less susceptible to the type of press and its condition.
2a) This is the control formulation but with the addition of a small amount of an organo-borate compound (Showa D. 3PB) used as a co-initiator. This plate took longer to develop than plates 1a or 1b but had a much more durable image. This coating was much less sensitive to press type or conditions and also had better run length than 1b.
2b) Using the same coating formula as 2a the plate was put through a pre-heat of 100 degrees C. for 1 minute prior to being mounted on press. The plate was slower to develop than 2a and although the image was much tougher the background was not as clean causing the plate to print with a background tone.
3a) This coating was the same as #2 but the amount of DTTDA and 4-HBSA was doubled, which with the use of the organo-borate allowed the plate to have good development characteristics along with a good image. This made it easier to develop then 2a but it did not have as tough an image.
3b) This is coating 3a but the plate was exposed to a pre-heat of 100 degrees C. (for 1 minute) prior to being mounted on the press. This plate had a very tough image but was slower to develop then 3a and did not have a completely clean background.
4a) This is the same as formula #1 but the Triazine AC was replaced with the onium salt Diphenyl Iodonium Hexa-Flouro Phosphate. This change not only allowed the plate to develop faster on press but it also produced a slightly better image then #1 with a good clean background.
4b) This is coating 4a except the plate was exposed to a pre-heat of 100 degrees C. for 1 minute prior to mounting on press. The plate developed as fast as #1 having a strong image with good integrity. The plate had a decent run but was still somewhat susceptible to press conditions.
5a) This is the same as coating 4a except for the organo-borate. The plate produced from this coating was slower to develop than plate 4a. It had a good image with a clean background.
5b) This is coating 5a with a preheat of 100 degrees C. for 1 minute prior to mounting on press. This coating developed at approximately the same speed as 5a. The image was very strong with good integrity but the background printed with a very slight tone.
6a) This is coating formula #5 with double the amount of the DTTDA and 4-HBSA. These plates had a good roll up on press with a clean background. The image was sound but not quite as strong as #5.
6b) These plates were coated with the formula of #6 but were exposed to a pre-heat prior to being mounted on press. In the previous pre-heat trials the plates could not exceed a temperature of 100 degrees C. without either losing a clean background or loss of development altogether. With the increase in the developing aids the plates were able to take a pre-heat of 120 degrees C. for 1 minute and still maintain good development with a strong image and a clean background.

Coating Chemistry without Enhancement for Water Penetration

Although the Tables above were based on varying the components of a composition which included a solvent soluble, partially water soluble organic compound, the effects of these variations are likely to be instructive for compositions without such organic compound. It should be appreciated that a key aspect of the embodiment without the partially water soluble organic compound, is that the cohesion of the unimaged coating is greater than the adhesion of the unimaged coating to the substrate. Some compositions in the foregoing tables that show promise (because of the efficacy of the partially soluble compound) may not be suitable for this embodiment if the adhesion is not less than the cohesion, however, one of ordinary skill in the art can readily select and optimize many of the compositions in the Tables by omitting the partially water soluble organic compound.

There are many types of resins, oligomers and monomers that can be used to produce coatings that would have properties suitable for use in the present invention. It is believed that the monomer to polymer ratio in the range of 2-4 and the use of an organo-borate catalyst with an onium salt catalyst are important preferences. A wide mixture of functionalities can be used but cured coatings with better adhesion and cohesion are achieved with multi functional monomers and oligomers (functionality of 3 or higher). It is not necessary to use a resin which contains unsaturated groups but in the majority of the cases the cured film will exhibit better adhesion and integrity. Types of resins can include poly vinyls (poly vinyl acetate, poly vinyl butyral, etc), cellulosic, epoxies, acrylics and others as long as the resin does not produce a strong adhesive bond with the substrate. Monomers and oligomers should be somewhat viscous liquids and can be polyester/polyether, epoxy, urethane acrylates or methacrylates (such as polyether acrylate, polyester acrylate, modified epoxy acrylate, aliphatic urethane methacrylate, aliphatic urethane acrylate oligomers, polyester acrylate oligomers, aromatic urethane acrylate, dipentaerythritol pentaacrylate, pentaacrylate ester, etc.).

Clean Fountain Water and Press Ink

Upon further investigation of on-press development using the tension forces imposed on the ink between the imaged coating and the blanket roll to pull off the nonimage areas as particulates without dissolution, we have discovered that neither the fountain water nor press ink is contaminated with resinous material or colorant. This overcomes the problems faced by the known on-press methods, as discussed in the Background portion of the present specification.

As used herein, "fountain water" includes substantially pure water as well as fountain solution, which is predominantly water with other materials in solution such as alcohol. These materials are colorless and do not contribute to the problems caused by dissolution of water-soluble resin and other active ingredients in the oleophilic coating. Similarly, a typical water soluble oxygen barrier such as PVOH has no more adverse effect than the alcohol in fountain solution. As used herein, "press ink" should be understood as an emulsion of fountain water droplets distributed in an ink continuum applied as a film on the plate cylinder in a wet press. The fountain water volume content is typically about 4%. Also, the terms "unimaged coating areas" and "nonimage coating areas" are synonymous.

One particular method of imaging and on-press development of a lithographic printing plate according to this advantage of removing undissolved particles of non image coating, begins with selecting a plate having a substrate with (i) a grained and anodized hydrophilic surface, (ii) a negative working, organic, polymerizable coating of at least one layer, which coating includes (a) active components for polymerization which are all insoluble in any of the group of fluids consisting of water, fountain solution and ink, (b) an optional water insoluble colorant, and (c) an optional non-active, non-resinous, non-colorant water soluble material, e.g., DTTDA. The coating is non-ionically bonded to the substrate. The non-active, non-resinous, non-colorant water soluble material can be one or both of an oxygen barrier, or an ingredient in the oleophilic coating, such as a partially water soluble, organic compound, e.g., DTTDA. In these coating compositions, the effective solubility in water is very low, e.g., such organic compound constitutes less than one weight percent of the coating weight and exhibits only a partial solubility in water of less than about 15 percent. As described elsewhere herein, the partially water soluble compound is not required because purely mechanical forces are sufficient to remove the non image coating areas. Preferably, none of any components of the PS coating is soluble or dispersible in press ink or fountain water.

The plate is imaged with radiation, especially by heating with infrared radiation, to activate the active components and thereby produce a pattern of relatively hardened image areas and as-coated nonimage areas that that were not affected by the radiation. As a consequence, the cohesion of the image areas is greater than the cohesion of the non image areas and the adhesion of the image areas to the substrate is greater than the adhesion of the nonimage areas to the substrate.

For on-press development, any topcoat oxygen barrier can be washed off before the plate is mounted to the plate cylinder of the press, or removed by the water present in the fountain fluid. On press, the ink form roll contacts and applies an ink film on the entire oleophilic coating. The ink film adheres to the oleophilic coating due to the adhesion of the ink continuum. Then the blanket roll contacts the coating while the plate is rotated on the plate cylinder. It should be appreciated that the ink film can be applied to the plate from a source of the emulsion, or by merging distinct sources of ink and fountain fluid, as is well known in the art. A rubber roll is opposed to the blanket roll.

When a newly mounted plate is on the press, a paper leader from a paper roll is fed between the blanket and rubber rolls, and these rolls are rotated to advance paper there between until the plate is fully developed, i.e., until the paper output no longer carries transferred particles of nonimage coating, at which point normal production printing begins.

Development occurs during multiple revolutions of the rolls whereby with each revolution increasing areas of the plate substrate are revealed as successive particles of nonimage coating are randomly and mechanically removed from the substrate. The blanket roll applies sufficient tension to the ink whereby the tack of the ink pulls off only nonimage areas from the substrate in the form of undissolved coating particles, including all the polymerization initiator, dye compound, and colorant that are transferred by the blanket with the ink to the paper leader. The preferred relationships of adhesion and cohesion on-press are shown in FIGS. 8-11.

During this process the ink emulsion splits whereby some of the initially entrained water adheres to the increasing surface areas of revealed, hydrophilic substrate. The remaining ink still contains some water as an emulsion. Importantly, none of the water on the substrate or in the ink contains any oleophilic material, dyes, colorants, resins, initiators or the like in dissolved form, because these were removed from the plate as undissolved solids and are ultimately transferred to the paper leader. The water on the substrate and the ink emulsion adhered to the image areas are transferred by the blanket to the paper without contamination by dissolved coating material.

It should be understood that the nonimage particles removed in accordance with the invention are large relative to the thicknesses of the PS coating and the ink pulled by the blanket. The PS coating thickness is typically in the range of 2-3 microns and the ink film thickness is typically less than 2 microns. The particles dislodged from the substrate retain the original PS coating thickness but would have a surface area ranging from the smallest screen size (in regions for printing shadows) to several square inches or more (in regions where the print image has white background). In an imaged plate for printing at a relatively high 2400 dpi resolution, the equivalent pixel area is 30-40 micron, which is at least ten times the thickness of the ink.

Since the resinous coating is not soluble or dispersible when contacted with fountain or ink, no development occurs before or during engagement of the plate by the ink form roll. It should be understood that in the present context this means the resinous coating does not dissolve or disperse in pure ink, press ink, pure water, or fountain solution. The nonimage coating areas are removed only when the blanket engages the inked plate, whereby the nonimage areas are pulled off from the substrate. When considered at a microscopic level, the particles are in essence delaminated from the substrate in the form of large, thin flat platelets adhered to the tacky surface of a comparably thin film of the ink emulsion. These relatively large platelets do not dissolve in and cannot disperse into the ink emulsion. Not only are the platelets far too large relative to the ink film to disperse in (become distributed throughout) the ink film, but once the coating dislodges from the substrate as platelets there is no compression between the ink and the coating that would force platelets into the ink film. It should be understood that the invention does not require that a large expanse of nonimage coating (e.g., several square inches) necessarily be dislodged as a single platelet during one revolution of the blanket. As discussed above, even the smallest platelet dislodged or broken off from a large expanse or only one pixel, is large as compared to the thickness of the ink film.

The difference in development mechanisms between reliance on mechanical forces and reliance on water sensitivity can be inferred from a comparison of wetting out characteristics derived from Table 10.

TABLE 10

Radiation Curable Coatings With and Without Water Soluble Components

| Ingredients | #1 | #2 | #3 | #4 | #5 | #6 | #7 |
|---|---|---|---|---|---|---|---|
| PGME | 94.990 | 94.990 | 94.990 | 94.990 | 94.990 | 94.990 | 94.990 |
| Poly 123 | 1.500 | — | — | 1.500 | 1.389 | 1.364 | 1.272 |
| Bayhydrol 2280 | — | 1.500 | — | — | — | — | — |
| ACA Z250 | — | — | 1.500 | — | — | — | — |
| Sartomer 399 | 1.750 | 1.500 | 2.000 | 1.500 | 1.852 | 1.818 | 1.271 |
| Satomer 454 | 0.250 | 0.250 | — | — | — | — | — |
| Sartomer 355 | — | 0.250 | — | — | — | — | — |
| Sartomer 9035 | — | — | — | 0.500 | — | — | 0.423 |
| IRT thermal Dye | 0.150 | 0.150 | 0.150 | 0.150 | 0.139 | 0.136 | 0.127 |
| Penn Color | 0.350 | 0.350 | 0.350 | 0.350 | 0.324 | 0.318 | 0.297 |
| Na-TP Borate | — | — | — | 0.200 | 0.084 | — | 0.339 |
| HOINPO2 | 0.400 | 0.350 | 0.050 | — | 0.286 | 0.364 | — |
| Showa-Denko P3B | — | 0.050 | 0.350 | 0.200 | — | — | — |
| Phenothiazine | 0.010 | 0.010 | 0.010 | 0.010 | 0.010 | 0.010 | 0.010 |
| Showa-Denko 2074 | 0.600 | 0.600 | 0.600 | 0.600 | 0.556 | 0.546 | 0.509 |
| 4-HBSA/Na | — | — | — | — | 0.370 | — | 0.339 |
| Simusol NW342 | — | — | — | — | — | 0.454 | 0.423 |
| TOTAL | 100.00 | 100.00 | 100.00 | 100.00 | 100.00 | 100.00 | 100.00 |

Formulations #1, #2 and #3 are examples of radiation curable coatings that contain no water soluble or water dispersible ingredients. Formulations #4, #5, #6 and #7 are examples of radiation curable coatings that use water soluble or water miscible ingredients. Formulation #4 contains a water soluble monomer (Sartomer 9035) and a water soluble catalyst (Na-TP borate). Formulation #5 contains a water soluble catalyst (Na-TP Borate) and a water soluble stabilizer (4-HBSA/Na). Formulation #6 contains a water soluble/miscible non-ionic surfactant (Simusol NW342). Formulation #7 contains all of the water soluble/miscible ingredients that are used in formulations #4, 5 and 6.

Imaged coatings with any of these seven formulations can be developed with high pressure water spray, water and rotating brush, or directly on press. The main difference is that formulations #1, 2 and 3 contain no ingredients that are water soluble or miscible, whereas formulations #4-7 contain at least one ingredient that is water soluble or miscible. Formulations #1-3 are consistent with the present invention, to the effect that a wide range of ingredients can be used in order to produce a lithographic printing that can be developed using only a mechanical force applied to the coating, without reliance on dissolution or dispersion of the coating in water (e.g., fountain fluid) or press ink.

The coatings that are produced from formulations #4-7 rely for development, on their solubility/miscibility in water and/or press ink. Press ink carries approximately 4% water, and known aqueous developable plates or plates that are developable on press in ink and/or fountain fluid incorporate some form of water sensitive ingredient (e.g., soluble/miscible material) in order to initiate and complete the development process. The water sensitive ingredients can be polymers, oligomers, monomers, catalysts, stabilizers and a number of other materials that are used to help coat ability, developability, hydrophilicity of the non image area, shelf life of the plate, pot life of the coating solution, etc. The water that is contained in the aqueous developers, fountain solutions and press inks either completely dissolves the non imaged areas of the coating or produces a more limited dissolution which allows the water to percolate through the film. Whether complete or limited, the dissolution of the film is controlled by the type and the amount of water sensitive ingredients that are used. Once the water is able to reach the hydrophilic surface of the substrate it undermines the non imaged area of the coating so that it can be further dissolved or dispersed in the water and/or ink.

Formulation #6 contains a surfactant which in practice produces a functionally similar effect on the water-insoluble ingredients of the coating, as water produces in dissolving water-soluble ingredients in coating formulations #4, 5, and 7. During aqueous development or on press, the surfactant penetrates the surface of the coating and on a microscopic or molecular level (analogous to dissolution) disassembles the integrity of the coating such that the coating disperses into the water or fountain fluid.

As previously described, a number of problems are associated with plates having coatings formulated with water sensitive materials. The imaged area of the coating that does the printing becomes less oleophilic which causes it to be less ink receptive. The imaged area of the plate tends to have poorer adhesion to the substrate, causing premature wear of the image producing short run lengths. When developed on press the water sensitive materials in the coating will cause the rest of the materials in the coating to be dissolved and/or dispersed in the fountain solution and ink. This will in turn cause other problems: The colorants (pigments and dyes) will cause the lighter inks to discolor (for example blue dyes and pigments will cause the yellow inks to turn green and the red inks purple). The water sensitive materials will cause the ink and the fountain solution to emulsify which will cause the plates to scum which in turn will produce dirty copies.

All plates having coating formulations #1-3 are comprised of a substrate with a hydrophilic surface and a very oleophilic radiation sensitive layer, but the mode of development of coating formulations #1-3 relies strictly on the adhesive and cohesive properties of the coating. These coatings as applied and prior to imaging exposure have better cohesive strength than adhesive strength. The adhesive strength of the ink to the non imaged coating is greater then the adhesive strength of the coating to the substrate. When the coating is exposed to radiation it undergoes polymerization which greatly amplifies its adhesive and cohesive strengths. The unexposed coating has weaker adhesion to the substrate and weaker cohesion to itself than that of the press inks. The higher surface energy of these coatings allows the press ink to adhere very strongly. This strong adhesion along with its greater cohesive strength allows the ink to delaminate the coating from the plate surface.

The imageable films produced from the seven coating variations listed above were tested for their surface energy and their ability to wet out with water. The extent of wetting is commensurate with the extent of solubilization or dispersion in water. The results of these tests can be seen in Table 11.

TABLE 11

Wetting Characteristics Described By Contact Angle

| | | | Formulations | | | | |
|---|---|---|---|---|---|---|---|
| | | #1 | #2 | #3 | #4 | #5 | #6 | #7 |
| Time in | 0 | 69.8 | 70.1 | 70.8 | 67.6 | 67.7 | 69.2 | 68.1 |
| Seconds | 1 | 71.7 | 72.1 | 71.8 | 48.2 | 66.5 | 65.6 | 65.0 |
| | 2 | 71.6 | 71.9 | 71.6 | 47.0 | 66.3 | 65.2 | 57.3 |
| | 3 | 71.5 | 71.9 | 71.6 | 46.6 | 66.3 | 65.0 | 55.5 |
| | 4 | 71.5 | 71.8 | 71.5 | 46.4 | 66.2 | 64.8 | 54.1 |
| | 5 | 71.4 | 71.8 | 71.5 | 46.2 | 66.2 | 64.6 | 53.1 |
| | 6 | 71.4 | 71.6 | 71.4 | 46.1 | 66.3 | 64.5 | 52.6 |
| | 7 | 71.4 | 71.6 | 71.3 | 46.0 | 66.2 | 64.4 | 52.6 |
| | 8 | 71.2 | 71.5 | 71.3 | 45.8 | 66.2 | 64.2 | 52.5 |
| | 9 | 71.2 | 71.5 | 71.2 | 45.6 | 66.2 | 64.2 | 52.3 |
| | 10 | 71.2 | 71.5 | 71.2 | 45.6 | 66.1 | 64.2 | 52.1 |

These tests were performed with a "Drop Shape Analysis System" DSA10 Mk1 that is manufactured by Kruss. The system measures the contact angle of a drop of water placed on the surface of the coatings of interest. The angle is formed by the tangent of the drop to the surface that it sits on. The higher the angle the more oleophilic the surface. The analysis is performed over a specified period of time in order to record any changes in the contact angle. If the contact angle starts high and remains that way then the surface is considered to be water repellent. The lower the contact angle and the more that it decreases over time indicates the water receptivity of the coating. Table 11 shows that formulations #1, 2 and 3 have contact angles that start high and remain virtually unchanged. Conversely, the data indicates that formulations #4, 5, 6 and 7 produce films that are water receptive. This is seen in that the contact angles start out lower (than #s 1, 2 and 3) and continue to decrease over a 10 second period. The more of a decrease that occurs the more the water is wetting out the surface and thus indicates that it is more water receptive.

After completion of the contact angle test the surfaces of the various coatings were inspected for any deterioration that occurred from the water drop. Coatings #1, 2 and 3 had no visible signs of attack. Coating #5 showed partial dissolution of the coating whereas coatings #4, 6 and 7 were completely dissolved.

A rub test was performed on each coating formulation using "virgin" ink (no water) for one test and press ink for a second test. All plates had a water-soluble top coat. The results can be seen in Table 12.

TABLE 12

Number of Double Rubs

| | | Virgin Ink | Press Ink |
|---|---|---|---|
| Formulation | #1 | 10 rubs | *10 rubs |
| | #2 | 10 rubs | *10 rubs |
| | #3 | 10 rubs | *10 rubs |
| | #4 | 10 rubs | 2 rubs |
| | #5 | 10 rubs | 3 rubs |
| | #6 | 10 rubs | 1 rubs |
| | #7 | 10 rubs | 1 rubs |

None of the formulations had any sensitivity to virgin ink. In plates with formulations #1-7 the virgin ink did not penetrate the hydrophilic top coat so none of the resinous coating was removed. The asterisks indicate that some coating was removed. When press ink was used on plates with formulations #1-3, the water in the press ink evidently penetrated the topcoat and the relatively mild compressive and shearing forces of the ten double rubs, mechanically pulled off a portion of the resinous coating from the substrate. In plates with formulations #4-7, the topcoat was also removed by the water in the press ink, but in addition the water in the ink dissolved and completely removed the resinous coating in no more than three double rubs. These tests confirm that the developing mechanism of plates with coatings #1-3 is very different from the development mechanism of plates with coatings #4-7.

The following list of representative ingredients will enable practitioners in this field to formulate coating compositions that are adapted to a meet targeted performance that balance cost of ingredients, coating process control, shelf life, range of imaging radiation wavelength, type or types of mechanical forces to be used for development, type of fountain and ink on press, and ease of achieving target resolution. The formulations #1-7 are thermally (IR) imageable as promoted by the IRT dye as a polymerization initiator, but can readily be prepared for either thermal or ultraviolet (UV) imaging by including a UV sensitive initiator such as Ciba-Geigy UV-10. The formulations #1-3 shown in Table 10 were selected for a particular comparison test, but for commercial purposes additional, non-active water insoluble ingredients can be included such as viscosity agents for facilitating coating of the plate, shelf life stabilizers, and agents for reducing any tendency for removed coating particles to build up in, e.g., a water and rotary brush processor. In variations not shown in Table 10, the solvent can be Arcosolve PM, DMF, and MEK; non-active stabilizers, pigments and the like can include Karenz PE1 and 29S1657 as well as the ACA Z 250. Urethane acrylate resins with active ingredients similar to formulation #2 and various water-insoluble inactive ingredients are presently preferred.

As a consequence, all of the nonimage coating is removed in solid particle form by the blanket and deposited on the waste leader. With the present invention, complete development of the plate without ink or water contamination is achieved with significantly fewer revolutions of the rolls. This saves the print operator significant cost associated with supplying ink and paper that is wasted in the course of developing the plate.

The invention claimed is:

1. A printing plate having a photosensitive (PS) coating to be radiation imaged and developed for printing on a lithographic press, comprising:
   a substrate with a grained, anodized, hydrophilic surface; and
   a radiation sensitive, negative working, organic, polymerizable PS resin coating non-ionically adhered to the substrate such that the cohesion of the PS coating exceeds the adhesion of the PS coating to the substrate;
   wherein the PS coating contains active components that participate in radiation induced polymerization, all of which active components are soluble in non-aqueous solvents and none of which active components are soluble or dispersible in any of the group of fluids consisting of water, fountain solution, ink, and press ink; and
   wherein said PS coating has sufficient cohesion and surface tack to adhere to and be mechanically pulled off the substrate by press ink as particulates without dissolution or dispersion into the press ink.

2. The printing plate of claim 1, wherein the active components of the PS coating before imaging, include a polymer and multi functional monomer and/or oligomer.

3. The printing plate of claim 1, wherein the active components of the PS coating include an organo-borate catalyst with one of a triazine or an onium salt catalyst.

4. The printing plate of claim 1, wherein the resin in said resin coating is selected from the group consisting of poly vinyls, cellulosic, epoxies, and acrylics.

5. The printing plate of claim 2, wherein the monomer and/or oligomer is selected from the group consisting of polyester, polyether, epoxy, urethane acrylates, and methacrylates.

6. The printing plate of claim 1, wherein
the PS coating comprises a urethane acrylate resin; and
the active components of the PS coating include an organo-borate catalyst with one of a triazine or an onium salt catalyst.

7. The printing plate of claim 1, including a top coat of a water soluble oxygen barrier.

8. The printing plate of claim 2, wherein
the resin in said resin coating is a polymer selected from the group consisting of acrylates, siloxanes, and styrene maleic anhydrides; and
the monomer is a multifunctional acrylate.

9. The printing plate of claim 1, wherein the active components include,
from about 5 to about 30 wt % based on solids content, of a urethane acrylate resin;
from about 35 to about 75 wt % based on solids content, of a radically polymerizable, multifunctional acrylate monomer and/or oligomer; and
an initiator system capable of initiating a polymerization reaction upon exposure to imaging radiation.

10. The printing plate of claim 1, wherein none of any components of the PS coating is soluble in press ink or fountain water.

11. The printing plate of claim 10, wherein the coating components include a pigment dispersion, a stabilizer, an IR dye, organo-borate catalyst, and an onium salt or triazine catalyst.

12. The printing plate of claim 10, wherein the active components include,
from about 5 to about 30 wt % based on solids content, of a urethane acrylate resin;
from about 35 to about 75 wt % based on solids content, of a radically polymerizable, multifunctional acrylate monomer and/or oligomer; and
an initiator system capable of initiating a polymerization reaction upon exposure to imaging radiation.

13. The printing plate of claim 12, wherein the coating components include a pigment dispersion, a stabilizer, and an IR dye.

14. The printing plate of claim 1, wherein the PS coating consists essentially of the following components, none of which are soluble or dispersible in any of the group of fluids consisting of water, fountain solution, ink and press ink:
(a) a urethane acrylate resin
(b) multi-functional acrylate monomer and/or oligomer
(c) pigment dispersion
(d) stabilizer
(e) IR dye
(f) organo-borate catalyst
(g) onium salt catalyst
(h) colorant.

15. The printing plate of claim 1, wherein none of any of the components of the PS coating are soluble or dispersible in any of the group of fluids consisting of water, fountain solution, ink and press ink.

16. The printing plate of claim 2, wherein the PS coating includes a monomer having a functionality of at least three and a monomer to polymer ratio in the range of about 2-4.

* * * * *